(12) United States Patent
Fujita

(10) Patent No.: US 7,598,138 B2
(45) Date of Patent: Oct. 6, 2009

(54) SEMICONDUCTOR DEVICE MANUFACTURING METHOD

(75) Inventor: Tohru Fujita, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 22 days.

(21) Appl. No.: 11/315,100

(22) Filed: Dec. 23, 2005

(65) Prior Publication Data

US 2007/0048933 A1 Mar. 1, 2007

(30) Foreign Application Priority Data

Aug. 30, 2005 (JP) .................. 2005-249435

(51) Int. Cl.
*H01L 21/8242* (2006.01)
*H01L 21/20* (2006.01)

(52) U.S. Cl. .................. 438/253; 438/243; 438/386; 438/399

(58) Field of Classification Search .................. 438/197, 438/234, 239, 253, 243–244, 386, 246, 387, 438/389, 396, 238, 399, 585; 257/192, 607, 257/616, 758
See application file for complete search history.

(56) References Cited

U.S. PATENT DOCUMENTS

| | | | |
|---|---|---|---|
| 4,350,536 A * | 9/1982 | Nakano et al. | 438/252 |
| 5,691,220 A * | 11/1997 | Ohnishi et al. | 438/253 |
| 5,864,143 A | 1/1999 | Ueda et al. | |
| 6,720,632 B2 * | 4/2004 | Noda | 257/408 |
| 6,809,359 B2 * | 10/2004 | Yamada | 257/292 |
| 2004/0212022 A1 * | 10/2004 | Inoue | 257/389 |

FOREIGN PATENT DOCUMENTS

| | | | |
|---|---|---|---|
| JP | 6-45541 | | 2/1994 |
| JP | 11-330373 | * | 11/1999 |
| KR | 1997-0063481 A | | 9/1997 |
| KR | 2002-0004361 A | | 1/2000 |

OTHER PUBLICATIONS

Korean Office Action mailed Nov. 20, 2006, issued in corresponding Korean Patent Application No. 10-2006-0004854.

* cited by examiner

*Primary Examiner*—Chuong A. Luu
(74) *Attorney, Agent, or Firm*—Westerman, Hattori, Daniels & Adrian, LLP.

(57) ABSTRACT

Provided is a semiconductor device manufacturing method including the steps of: forming an n-type impurity diffusion region by ion-implanting arsenic into a capacitor formation region of a silicon substrate under a condition that a beam current is not less than 1 μA but less than 3 mA; forming a capacitor dielectric film on the capacitor formation region of the silicon substrate; and forming a capacitor upper electrode on the capacitor dielectric film.

10 Claims, 19 Drawing Sheets

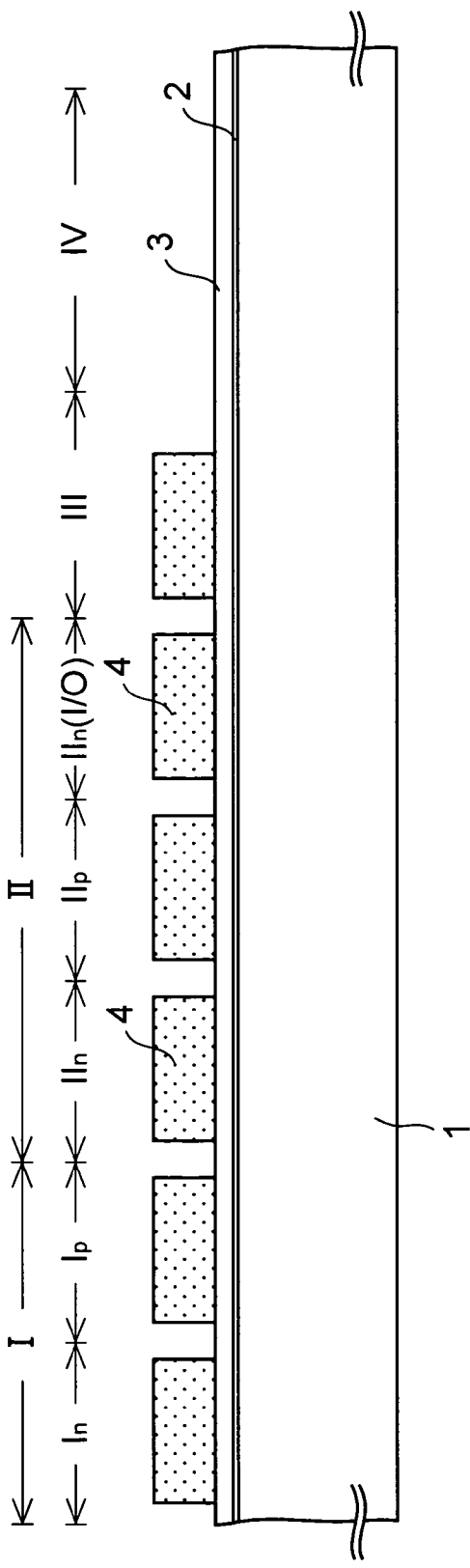
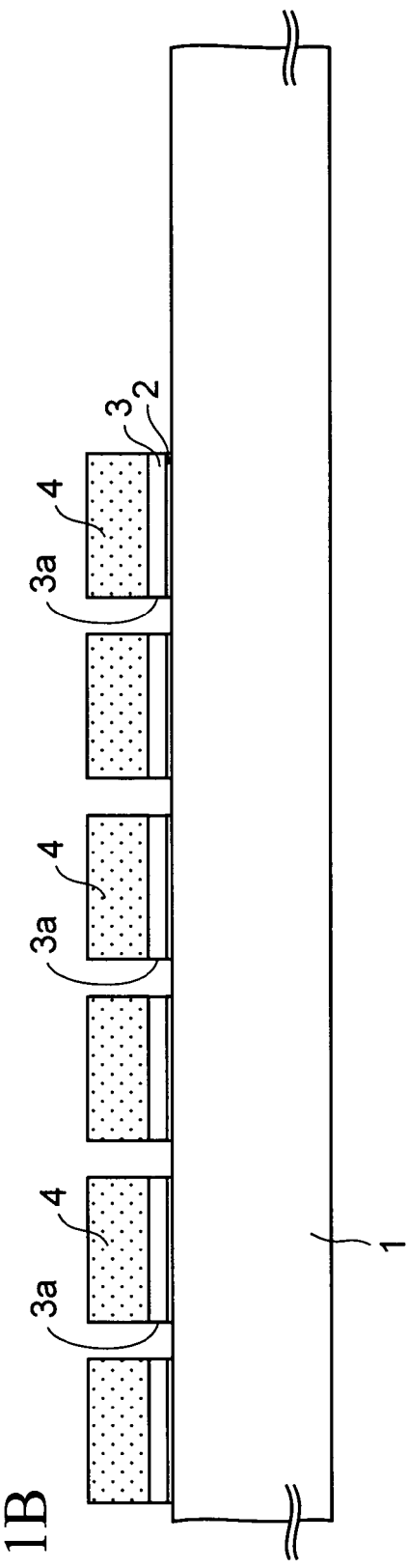

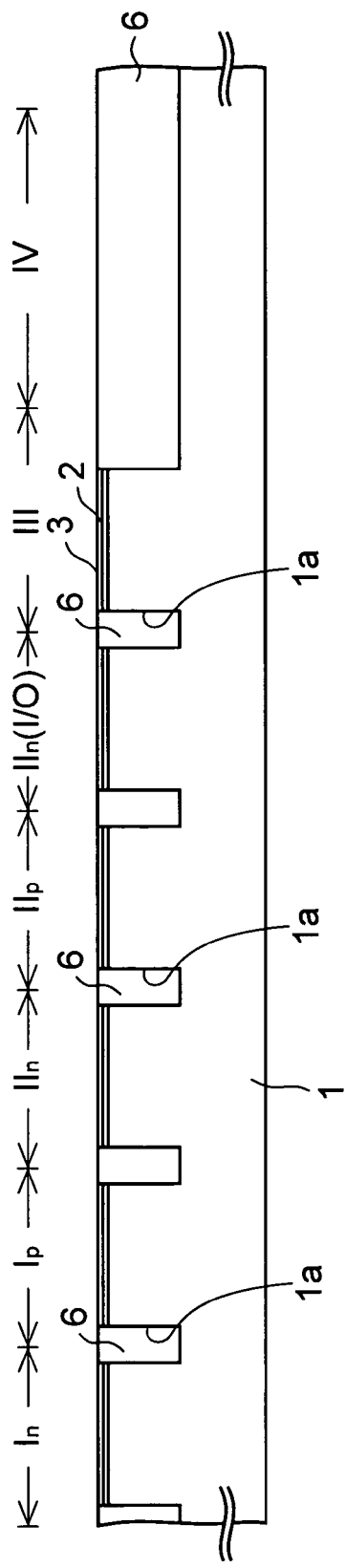
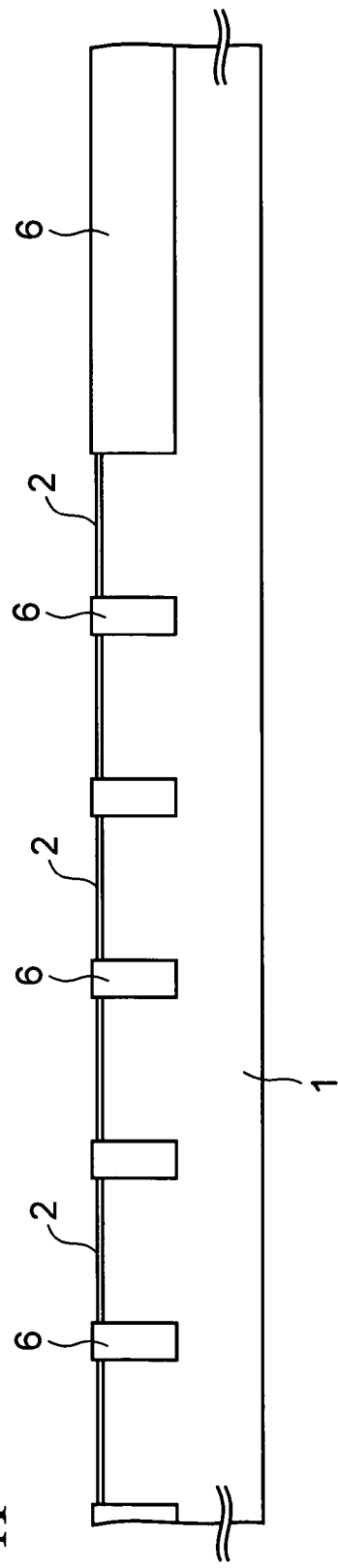

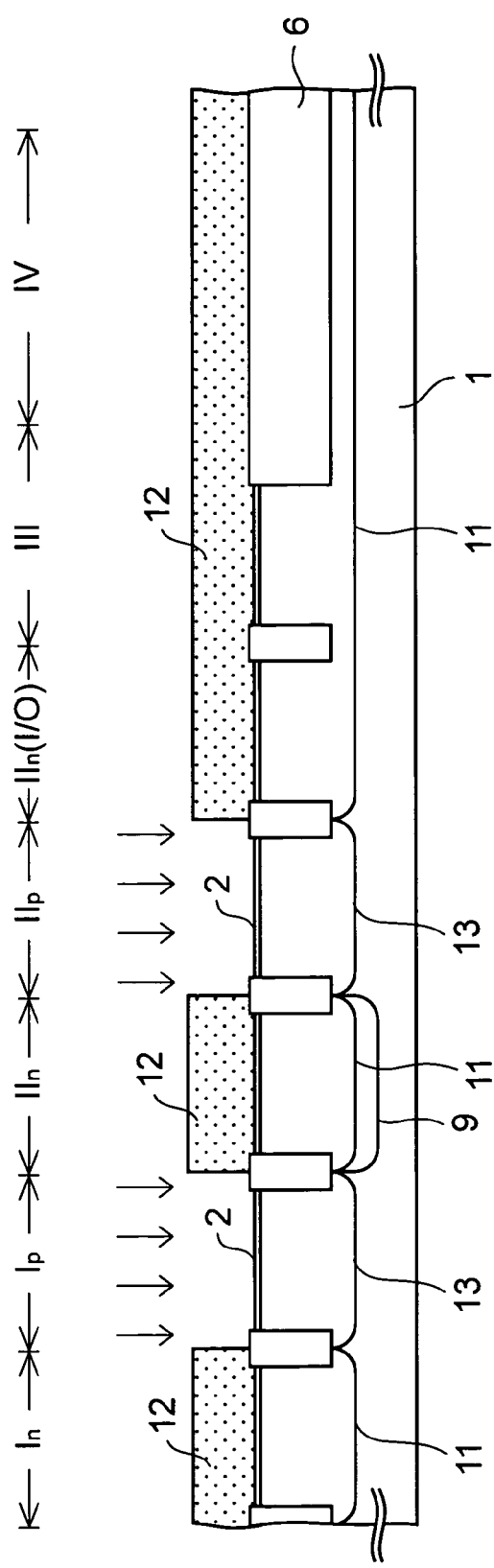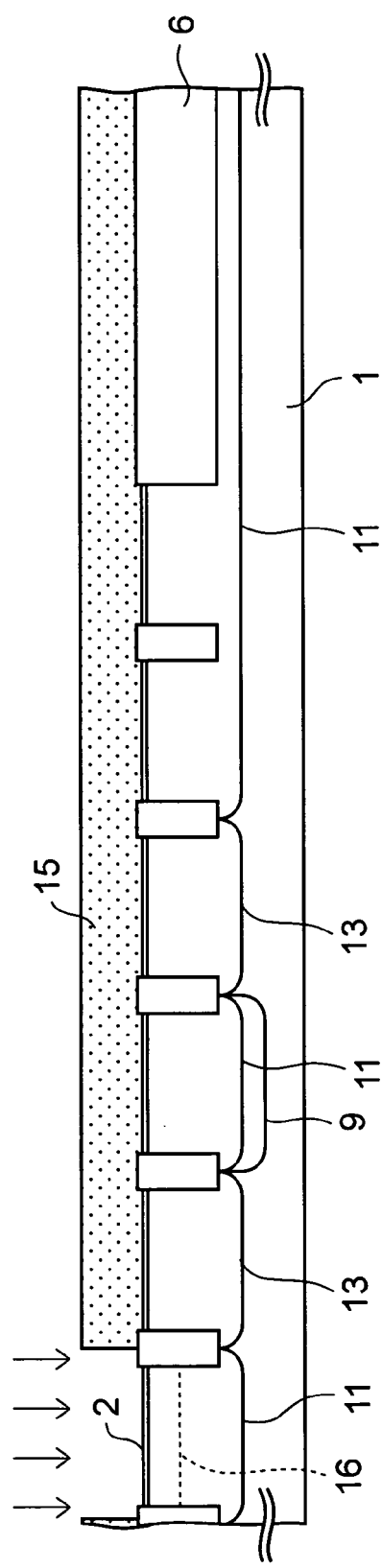
FIG. 1I
FIG. 1J

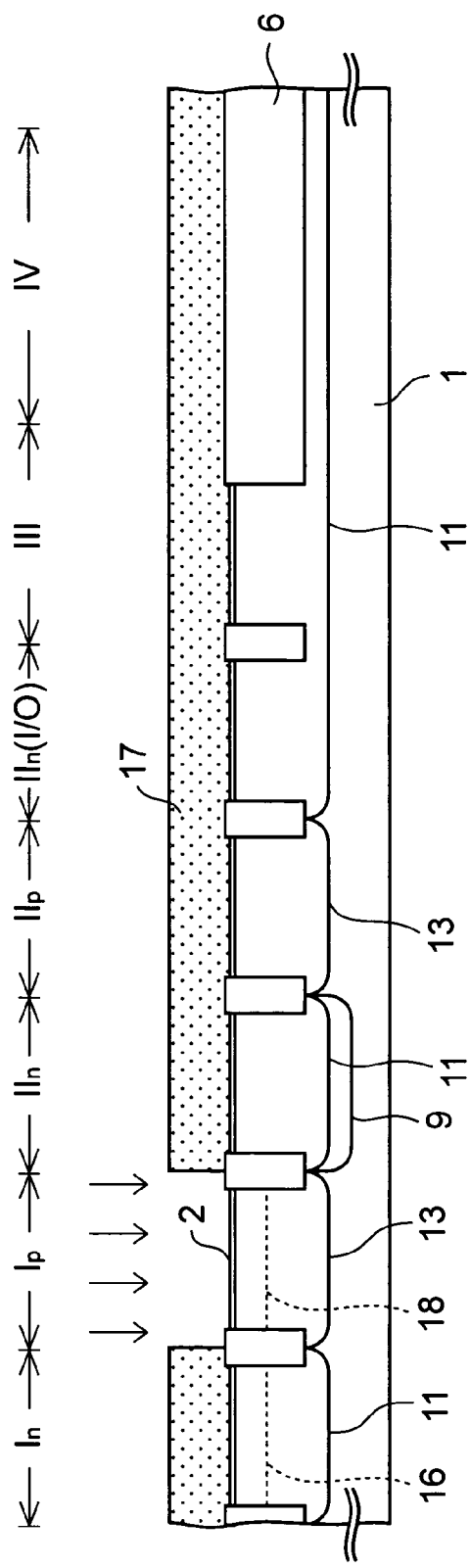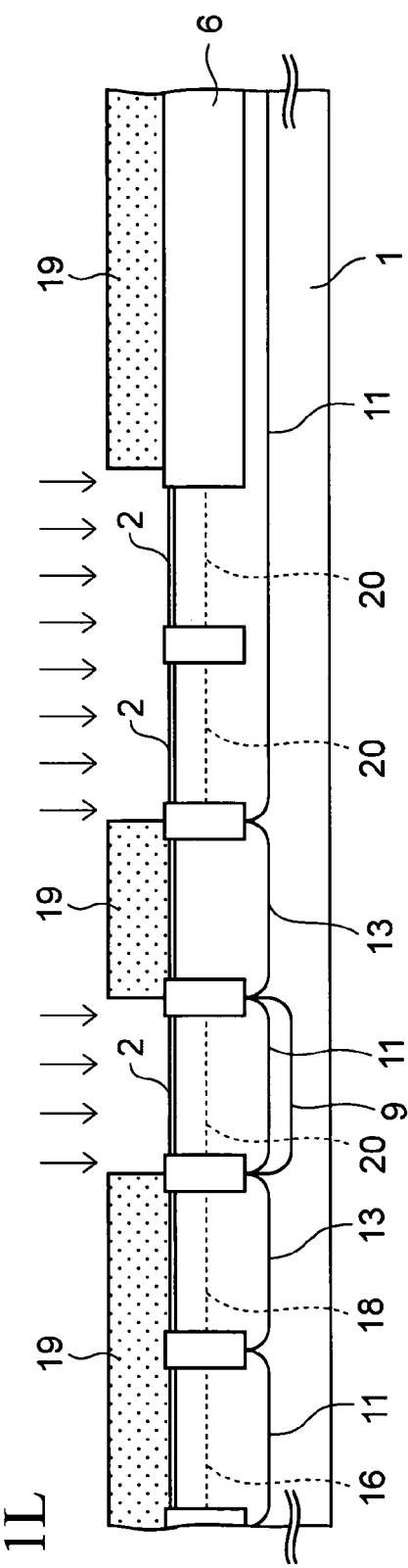

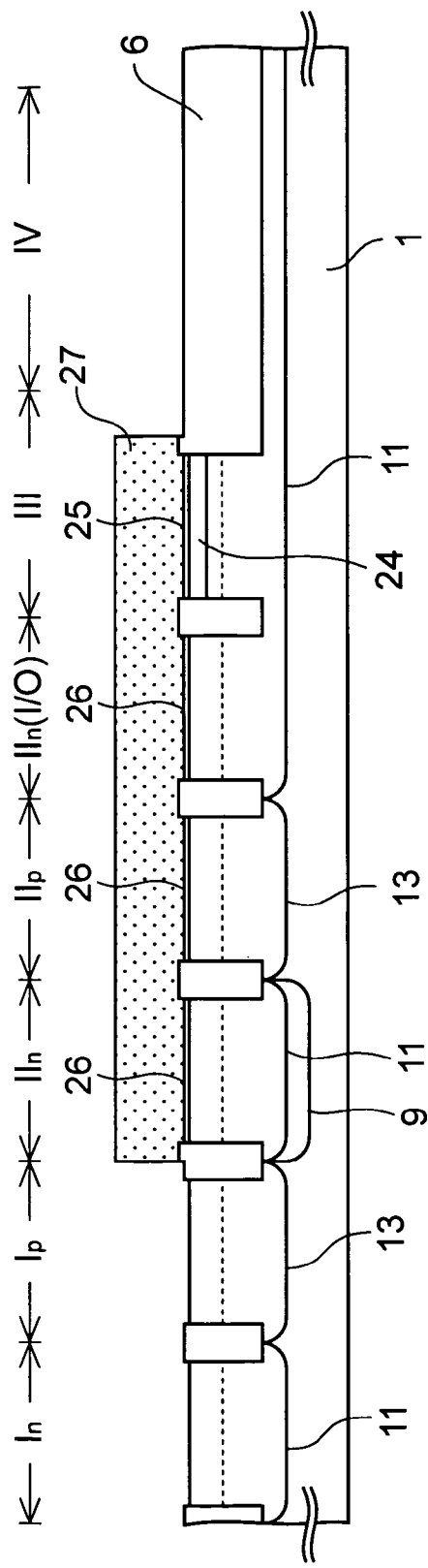
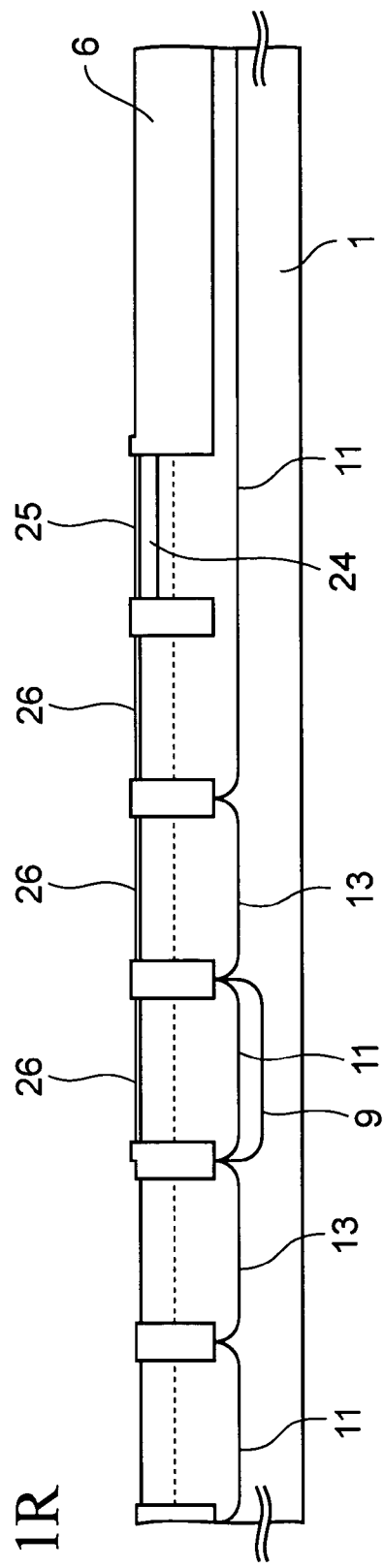

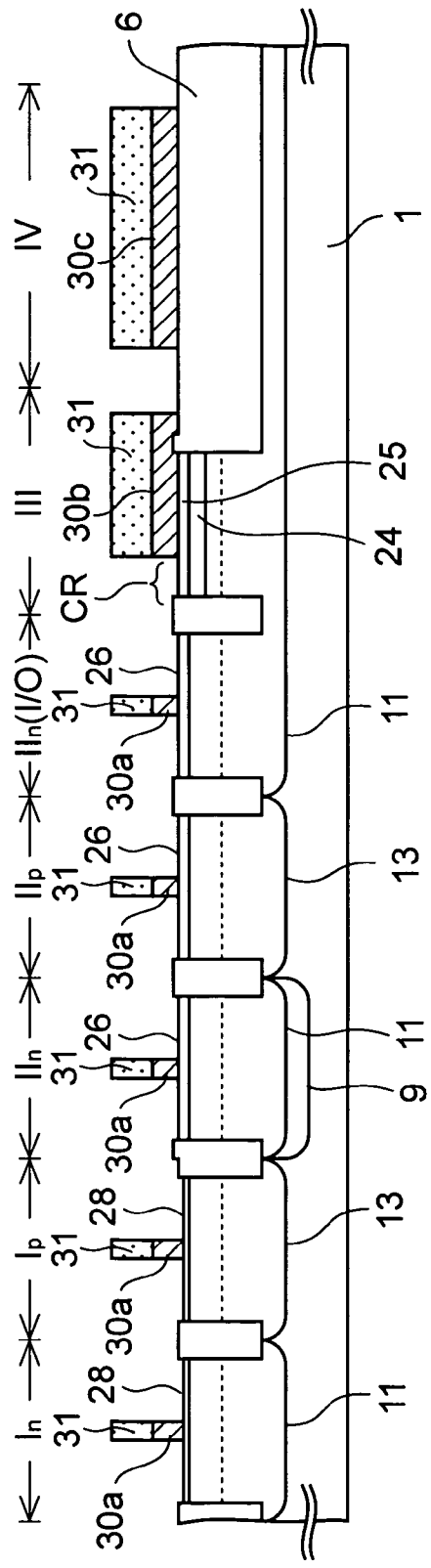
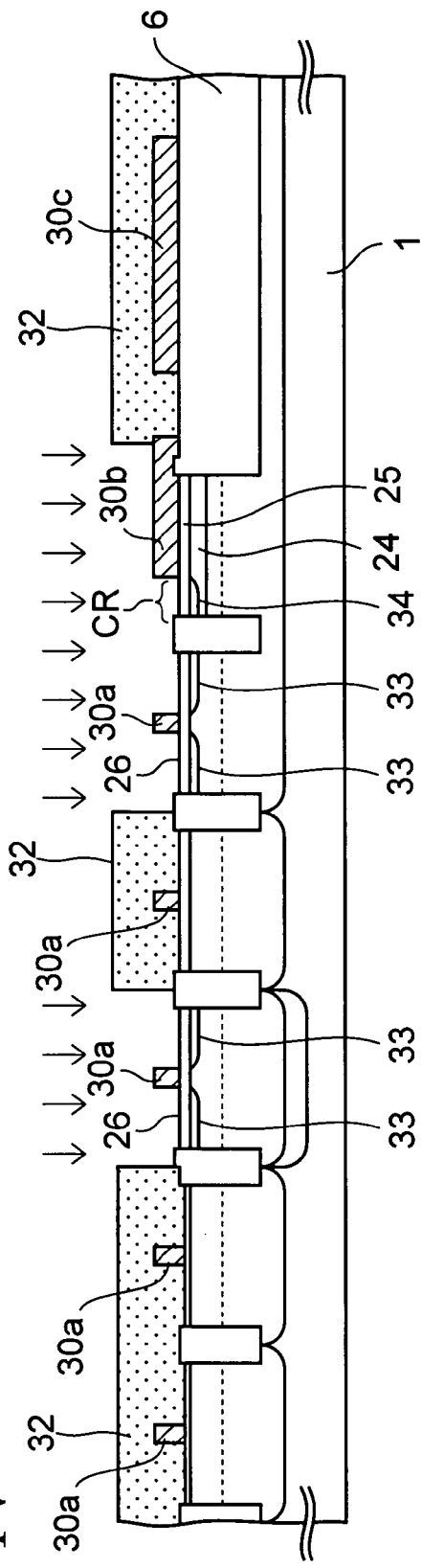

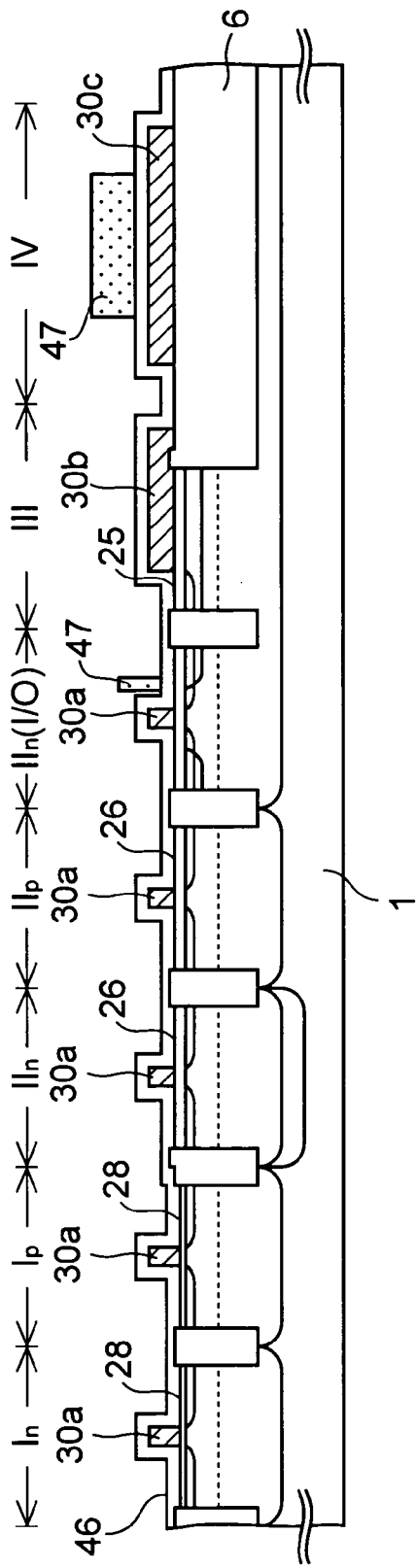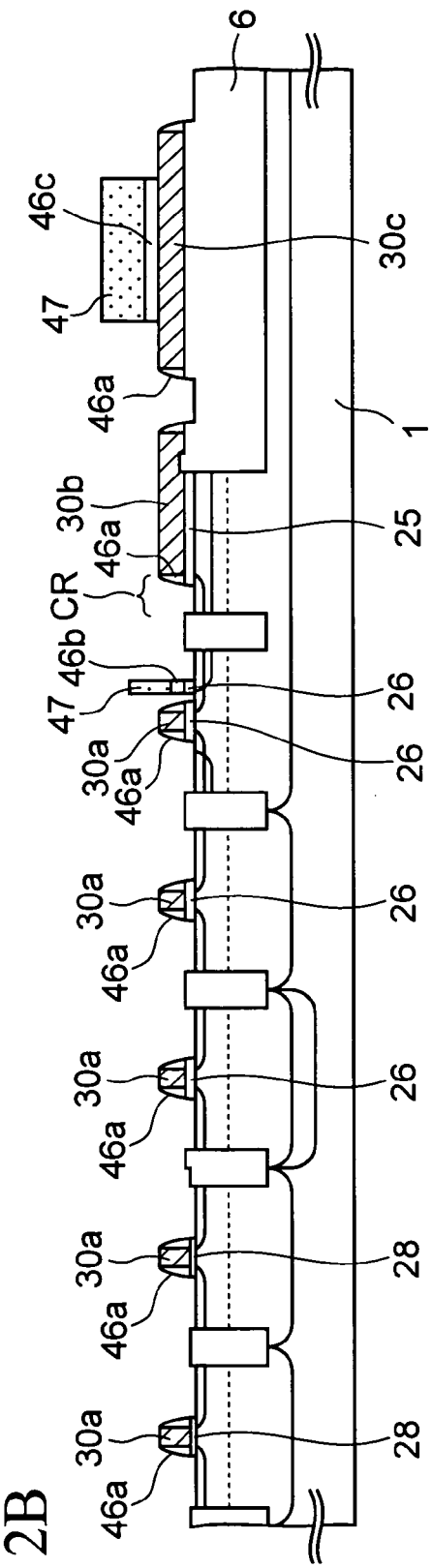

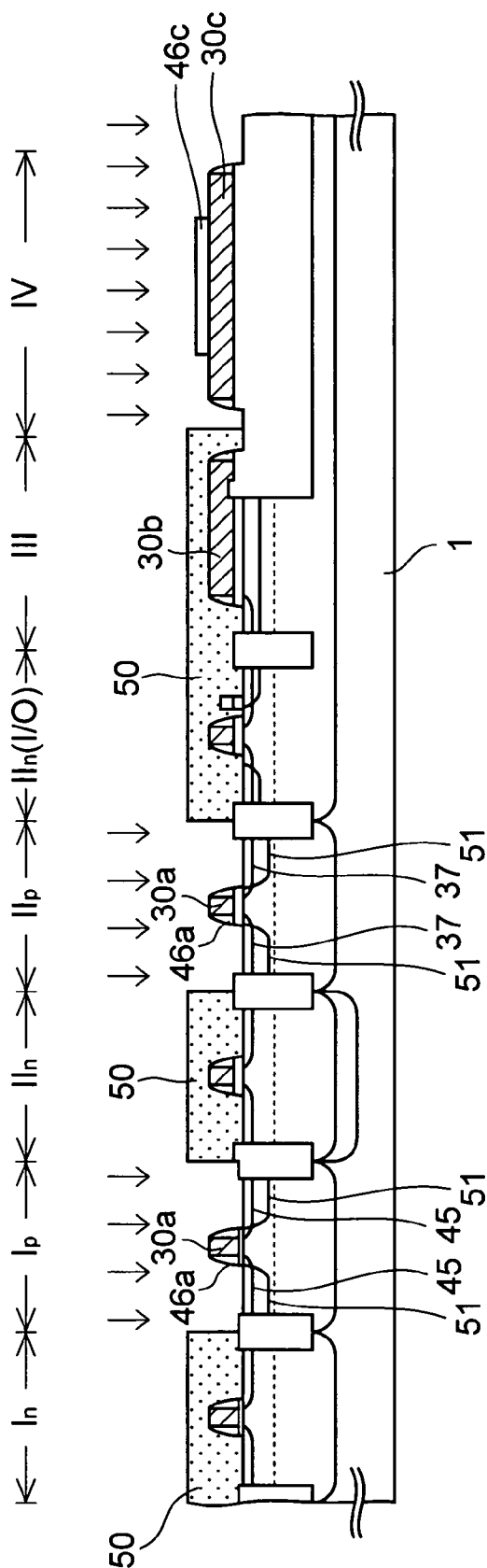
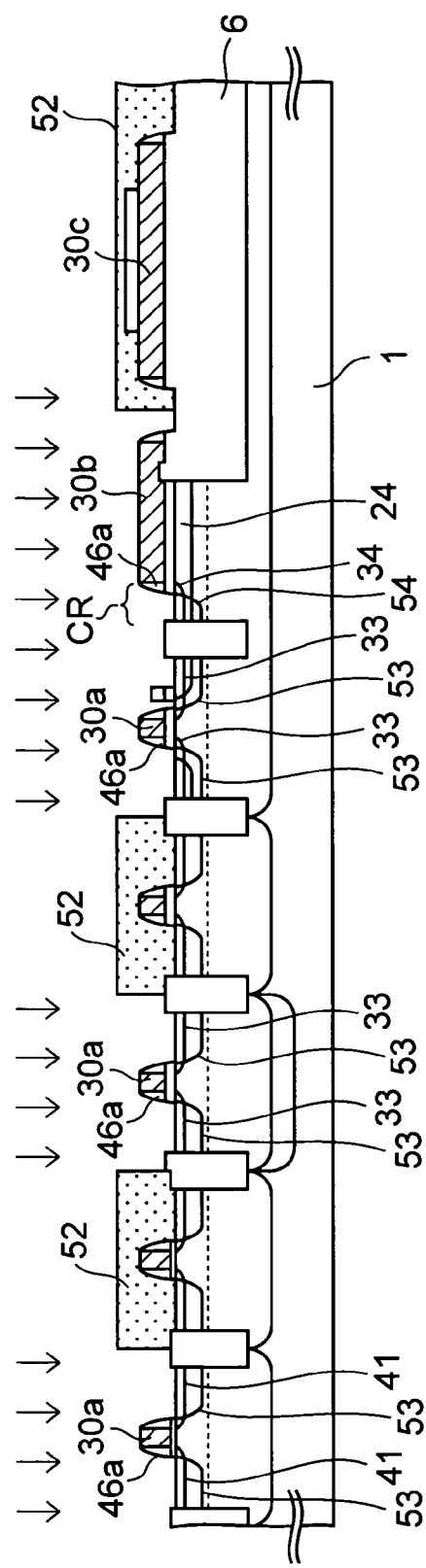

SEMICONDUCTOR DEVICE MANUFACTURING METHOD

CROSS-REFERENCE TO RELATED APPLICATIONS

This application is based on and claims priority of Japanese Patent Application No.2005-249435 filed on Aug. 30, 2005, the entire contents of which are incorporated herein by reference.

BACKGROUND OF THE INVENTION

1. Field of the Invention

The present invention relates to a semiconductor device manufacturing method.

2. Description of the Related Art

In a semiconductor device such as an LSI, in addition to an MOS transistor, a capacitor is formed on a semiconductor substrate for the purpose of computation processing, storage of information, or the like. Such capacitors may take various types of structures. Among those, a structure in which a lower electrode is formed of the impurity diffusion region of a semiconductor substrate is advantageous in that both the manufacturing process for the capacitor and that for an MOS transistor can be readily carried out in a compatible manner, because a capacitor dielectric film can be formed of the same thermal oxidation film as that forming a gate insulating film of the MOS transistor and an upper electrode can be formed of the same conductive film as that forming a gate electrode.

As described in the following Patent Literature 1, the problem with this type of capacitor is that when the impurity concentration in the impurity diffusion region serving as the lower electrode is low, the surface of a silicon substrate becomes depleted when the voltage applied to the capacitor is low, and hence the capacitance of the capacitor fluctuates. In order to reduce such dependency of the capacitance of the capacitor on the applied voltage, in this type of capacitor, it is preferable to set the impurity concentration in the above-mentioned impurity diffusion region to be as high as possible.

An impurity concentration is determined by the product (dose amount) of a beam current and implantation time of an ion implantation device. Accordingly, conventionally, a high-current ion implantation device capable of generating a high beam current on the order of 10 mA to 20 mA has been used to form the above-mentioned impurity diffusion region, whereby the impurity concentration in the impurity diffusion region has been increased.

However, when the amount of ion implantation to the impurity diffusion region is increased in this way in order to increase the impurity concentration, an amorphous layer is formed on the surface layer of the semiconductor substrate due to the ion implantation, which causes a decrease in the breakdown voltage of the thermal oxidation film that serves as the capacitor dielectric film. This causes another problem that the breakdown voltage between electrodes of the capacitor decreases, and that the decrease results in reduced reliability.

It should be noted that the technique relating to the present invention is also disclosed in the Patent Literature 2.

[Patent Literature 1] Japanese Patent Laid-open No. Hei. 11-330373

[Patent Literature 2] Japanese Patent Laid-open No. Hei. 6-45541

SUMMARY OF THE INVENTION

According to an aspect of the present invention, a semiconductor device manufacturing method is provided, the method including the steps of: forming an impurity diffusion region in a semiconductor substrate by ion-implanting an impurity into a capacitor formation region of the semiconductor substrate under a condition that a beam current is equal to or more than 1 µA but less than 3 mA; forming a capacitor dielectric film on the impurity diffusion region of the semiconductor substrate; and forming a capacitor upper electrode on the capacitor dielectric film.

According to the present invention, when forming the impurity diffusion region, which functions as the lower electrode of the capacitor, through ion implantation, the applied beam current is set to be equal to or more than 1 µA but less than 3 mA. By employing the beam current within this range, the thickness of an amorphous layer, which is formed on the surface layer of the semiconductor substrate due to the damage inflicted during the ion implantation, can be reduced. As a result, the breakdown voltage of the capacitor dielectric film formed on the impurity diffusion region can be inhibit from being lowered due to the influence of the amorphous layer, and it becomes possible to improve the breakdown voltage between electrodes of the capacitor.

As the capacitor dielectric film, there may be used, for example, a thermal oxidation film obtained through thermal oxidation of a surface of the semiconductor substrate in the impurity diffusion region. In this case, the amorphous layer undergoes crystallization to some degree due to the heat applied during the thermal oxidation.

Further, in the step of forming the capacitor dielectric film, a gate insulating film formed of the same insulating film as that forming the capacitor dielectric film may be formed on the transistor formation region of the semiconductor substrate, and in the step of forming the capacitor upper electrode, a gate electrode formed of the same conductive film as that forming the capacitor upper electrode may be formed on the gate insulating film.

In this way, the manufacturing process for the MOS transistor including the gate insulating film and the gate electrode, and the manufacturing process for the capacitor can be readily carried out in a compatible manner.

BRIEF DESCRIPTION OF THE DRAWINGS

FIGS. 1A to 1Z and FIGS. 2A to 2F are sectional views of a semiconductor device according to an embodiment of the present invention during the manufacture thereof.

DESCRIPTION OF THE PREFERRED EMBODIMENT

Figure 1C:
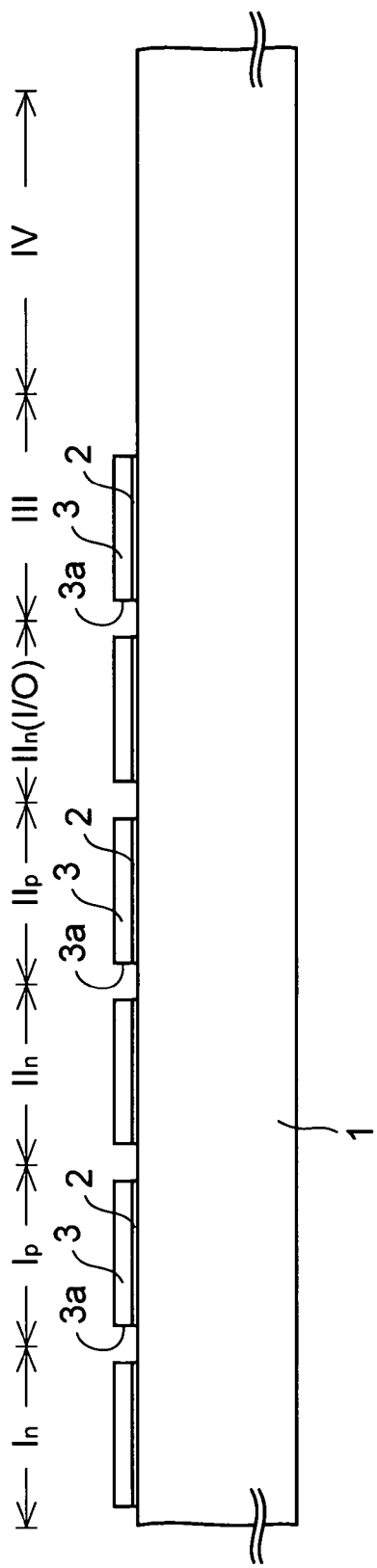

FIGS. 1A to 1Z and FIGS. 2A to 2F are sectional views of a semiconductor device according to an embodiment of the present invention during the manufacture thereof.

It should be noted that while there is no particular limitation as to the kind of the semiconductor device used, in the following, the description is directed to the example of an analog device to be used together with a logic IC.

First of all, the processes to be performed before obtaining the sectional structure shown in FIG. 1A will be described.

First, in an atmosphere containing HCl and oxygen, the surface of a p-type silicon (semiconductor) substrate 1 is subjected to thermal oxidation with the substrate temperature being 900° C. to thereby form a thermal oxidation film 2 having a thickness of about 10 nm, and then a silicon nitride film 3 having a thickness of about 150 nm is further formed thereon by a low pressure CVD method.

The silicon substrate 1 has a low voltage MOS transistor formation region I, a high voltage MOS transistor formation region II, a capacitor formation region III, and a resistance formation region IV. Among these regions, the low voltage MOS transistor formation region I is divided into an n-type low voltage MOS transistor formation region $I_n$ and a p-type low voltage MOS transistor formation region $I_p$. Further, the high voltage MOS transistor formation region II is divided into an n-type high voltage MOS transistor formation region $II_n$, a p-type high voltage MOS transistor formation region $II_p$, and an input/output n-type high voltage MOS transistor formation region $II_n(I/O)$.

Next, a photoresist is applied onto the silicon nitride film 3, followed by exposure and development thereof to thereby form an island-like first resist pattern 4 on each of the regions I to III as shown in the drawing.

Next, as shown in FIG. 1B, with the first resist pattern 4 serving as the mask, etching is performed on the silicon nitride film 3 and the thermal oxidation film 2 through Reactive Ion Etching (RIE) using a fluorine-based gas as the etching gas, whereby an opening 3a is formed in each of these films.

Thereafter, as shown in FIG. 1C, the first resist pattern 4 is removed.

Figure 1D:
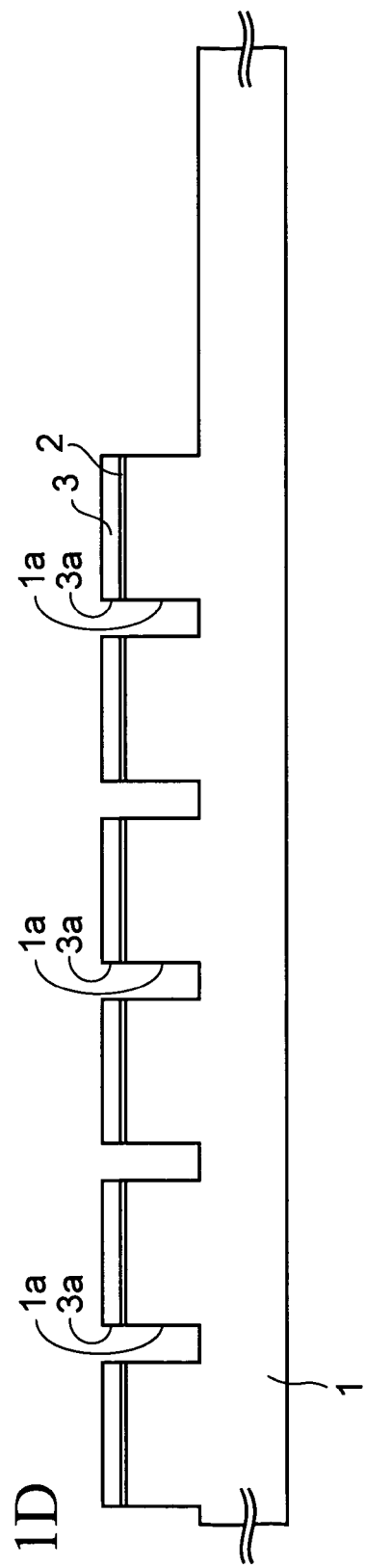

Subsequently, as shown in FIG. 1D, RIE using chlorine-based gas as the etching gas is employed to perform etching on the silicon substrate 1 through the opening 3a, thereby forming a isolation groove 1a with a depth of about 40 nm.

Next, the processes to be performed before obtaining the sectional structure shown in FIG. 1E will be described.

First, in order to recover the damage inflicted on the inner surface of the isolation groove 1a due to RIE, a thermal oxidation film (not shown) having a thickness of about 10 nm is formed within the isolation groove 1a. Thereafter, a silicon oxide film is formed on the silicon nitride film 3 through a High Concentration Plasma CVC (HDPCVD) method using silane as the reaction gas, and the isolation groove 1a is completely filled with the silicon oxide film thus formed. Next, any excess silicon oxide film on the silicon nitride film 3 is polished away by a Chemical Mechanical Polishing (CMP) method, so the silicon oxide film remains as a device isolation insulating film 6 within the isolation groove 1a. The isolation structure thus obtained is also referred to as Shallow Trench Isolation (STI).

It should be noted that while the silicon nitride film 3 functions as a polishing stopper during the CMP process described above, the thickness thereof becomes slightly smaller because of the polishing.

Next, as shown in FIG. 1F, the silicon nitride film 3 is removed away by wet etching using phosphoric acid to expose the thermal oxidation film 2.

Figure 1G:
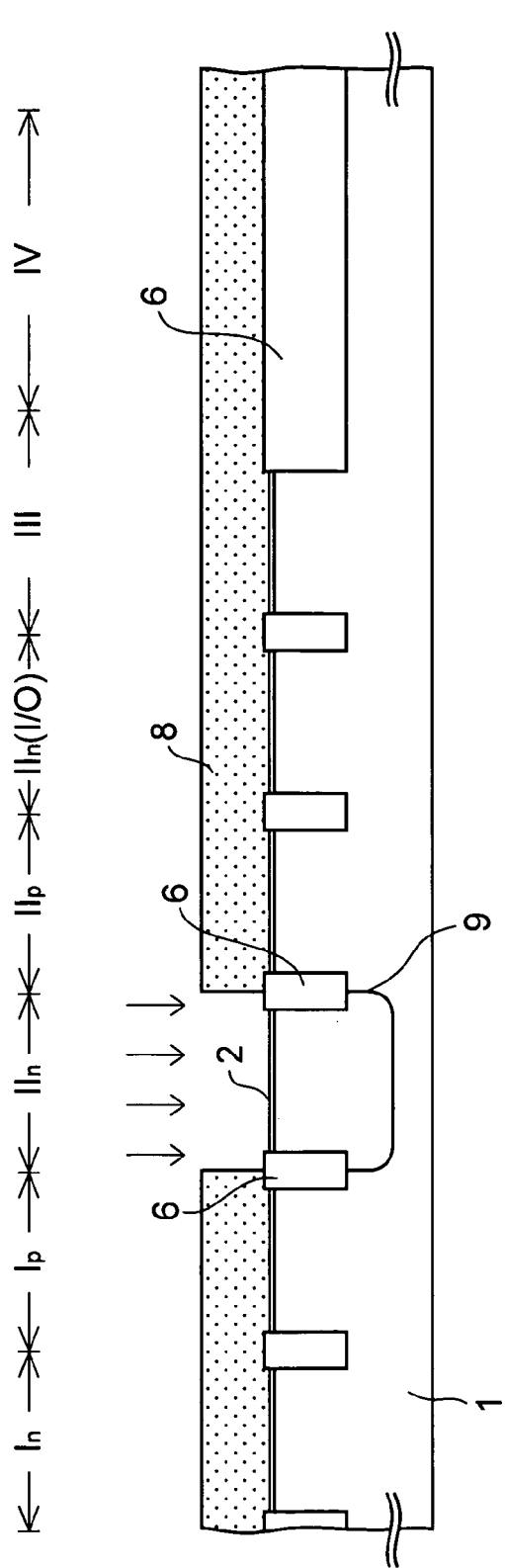

Subsequently, as shown in FIG. 1G, a photoresist is applied onto the entire upper surface of the silicon substrate 1 followed by exposure and development thereof, whereby a second resist pattern 8 having a window in n-type high voltage MOS transistor formation region $II_n$ is formed. Then, an n-type impurity such as phosphorous is ion-implanted through a window of the second resist pattern 8, whereby a first n-well 9 is formed in the n-type high voltage MOS transistor formation region $II_n$ of the silicon substrate. It should be noted that the thermal oxidation film 2 on the first n-well 9 functions as a through-film during the ion implantation.

Thereafter, the second resist pattern 8 is removed.

Figure 1H:
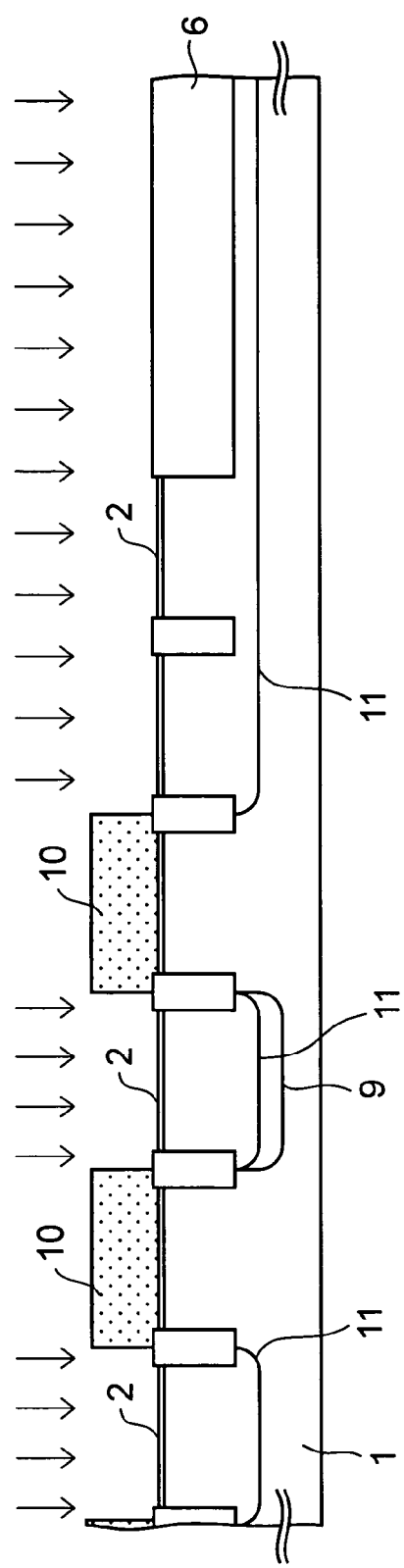

Next, as shown in FIG. 1H, a photoresist is applied onto the entire upper surface of the silicon substrate 1 followed by exposure and development thereof, whereby a third resist pattern 10 covering the p-type low voltage MOS transistor formation region $I_p$ and the p-type high voltage MOS transistor formation region $II_p$ is formed. Then, with the third resist pattern 10 serving as the mask and the thermal oxidation film 2 serving as the through-film, a p-type impurity such as boron is ion-implanted into the silicon substrate 1 in order to form p-well 11 in each of the regions $I_n$, $II_n$, $II_n(I/O)$, III, and IV of the silicon substrate 1.

Thereafter, the third resist pattern 10 is removed.

Subsequently, as shown in FIG. 1I, a fourth resist pattern 12, which has windows provided at positions above the p-type low voltage MOS transistor formation region $I_p$ and the p-type high voltage MOS transistor formation region $II_p$, is formed on the silicon substrate 1. Then, while the thermal oxidation film 2 is used as the through-film, an n-type impurity such as phosphorous is ion-implanted into the silicon substrate 1 through the windows of the fourth resist pattern 14 in order to form a second n-well 13 in each of the regions $I_p$ and $II_p$ of the silicon substrate 1.

After this ion implantation, the fourth resist pattern 12 is removed.

Next, as shown in FIG. 1J, a fifth resist pattern 15, which has a window provided at a position above the n-type low voltage MOS transistor formation region $I_n$, is formed on the silicon substrate 1. Then, a p-type impurity such as boron is ion-implanted into the silicon substrate 1 through the window of the fifth resist pattern 15 in order to form a first threshold-voltage-adjusting n-type impurity diffusion region 16 for adjusting the threshold voltage of the n-type low voltage MOS transistor.

Thereafter, the fifth resist pattern 15 is removed.

Next, as shown in FIG. 1K, a photoresist is applied onto the entire upper surface of the silicon substrate 1 followed by exposure and development thereof, whereby a sixth resist pattern 17 having a window provided at a position above the p-type low voltage MOS transistor formation region $I_p$ is formed. Subsequently, an n-type impurity such as arsenic is ion-implanted into the silicon substrate 1 through the window of the sixth resist pattern 17 in order to form a first threshold-voltage-adjusting p-type impurity diffusion region 18 for adjusting the threshold voltage of the p-type low voltage MOS transistor. After this ion implantation, the sixth resist pattern 17 is removed.

Then, as shown in FIG. 1L, a seventh resist pattern 19 is formed on the silicon substrate 1, the seventh resist pattern 19 having windows provided at positions above the n-type high voltage MOS transistor formation region $II_n$, the input/output n-type high voltage MOS transistor formation region II$_n$ (I/O), and the capacitor formation region III.

Then, an n-type impurity is ion-implanted into the silicon substrate 1 through the windows of the seventh resist pattern 19 in order to form a second threshold-voltage-adjusting n-type impurity diffusion region 20 for adjusting the threshold voltage of the n-type low voltage MOS transistor.

Thereafter, the seventh resist pattern 19 is removed.

Figure 1M:
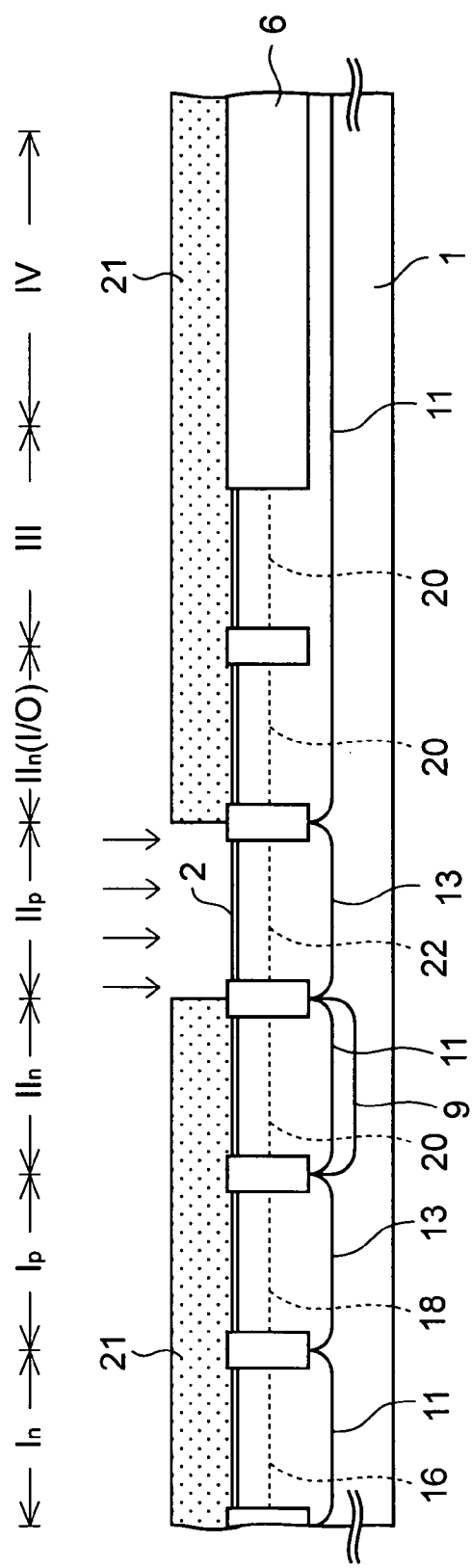

Subsequently, as shown in FIG. 1M, an eighth resist pattern 21 is formed on the silicon substrate 1, and a p-type impurity such as boron is ion-implanted into the silicon substrate 1 through a window of the eighth resist patter 21. Accordingly, there is formed, in the p-type high voltage MOS transistor formation region II$_p$ of the silicon substrate 1, a second threshold-voltage-adjusting p-type impurity diffusion region 22 for adjusting the threshold voltage of the p-type low voltage MOS transistor.

Thereafter, the eighth resist pattern 21 is removed.

Next, the processes to be performed before obtaining the sectional structure shown in FIG. 1N will be described.

First, a photoresist is applied onto the entire upper surface of the silicon substrate 1 followed by exposure and development thereof, whereby a ninth resist pattern 23 having a window provided at a position above the capacitor formation region III is formed. Then, under the conditions that the implantation energy is equal to or higher than 50 keV but not higher than 70 keV, more preferably 60 keV, and that the dose amount is set to $1 \times 10^{15} \mathrm{cm}^{-2}$, and while using the thermal oxidation film 2 as the through-film, an n-type impurity such as arsenic is ion-implanted through the window of the ninth resist pattern 23. Accordingly, an n-type impurity diffusion region 24, which also serves as the lower electrode of the capacitor, is formed in the capacitor formation region III of the silicon substrate 1. By performing the ion implantation with the thermal oxidation film 2 serving as the through-film, it is possible to prevent the surface of the silicon substrate 1 from becoming rough in the capacitor formation region III.

Incidentally, at the time of the ion implantation, the capacitor formation region III of the silicon substrate 1 suffers damage due to arsenic. For this reason, as indicated by the dashed circle in the figure, the surface layer portion of the silicon substrate 1 becomes amorphous, so an amorphous layer 1b is formed in this portion.

After completing this ion implantation, the ninth resist pattern 23 is removed.

After removing the ninth resist pattern 23, the silicon substrate 1 may be subjected to Rapid Thermal Anneal (RTA) in nitrogen atmosphere for the purpose of recrystallizing the amorphous layer 1b. The conditions for RTA to be adopted at this time may be such that, for example, the substrate temperature is 1000° C. and the processing time is for 10 seconds.

Further, in this example, while arsenic not susceptible to thermal diffusion is used as the n-type impurity to be implanted into the n-type impurity diffusion region 24, phosphorous may be used instead of arsenic. Although phosphorous is more susceptible to thermal diffusion than arsenic, by performing RTA with a short processing time as heat treatment such as activation annealing that will be described later, it is possible to suppress the breakage of the impurity concentration profile of the n-type impurity diffusion region 24 to the minimum level, the breakage caused by thermal diffusion.

Figure 1N:
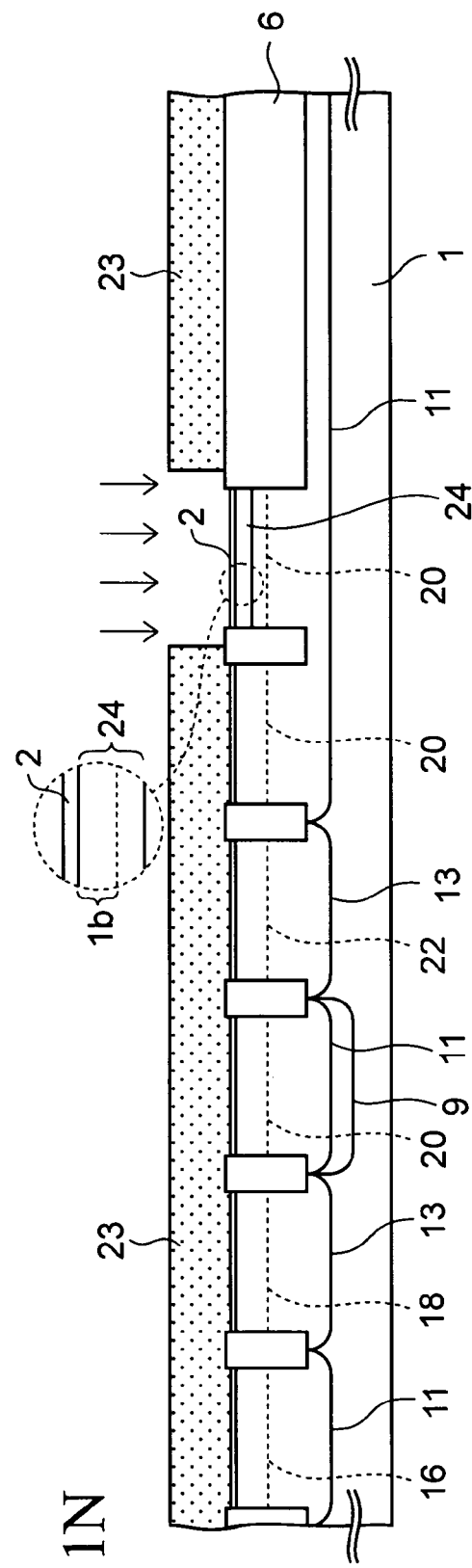
Figure 1O:
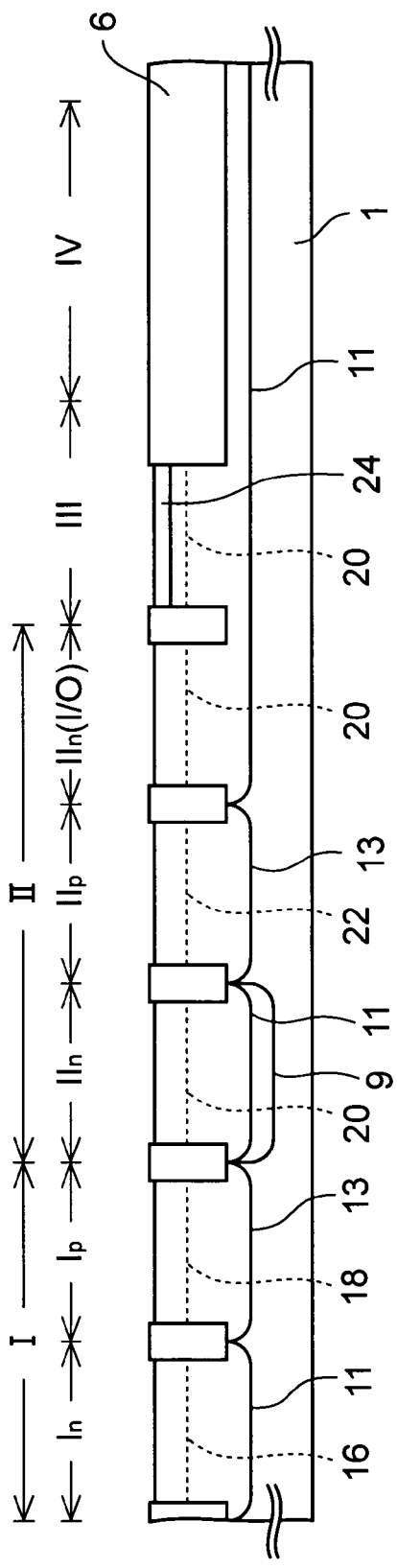

Next, as shown in FIG. 1O, the thermal oxidation film 2 that has been damaged due to the above-mentioned ion implantations mentioned above is removed by wet etching in a hydrofluoric acid solution in order to expose the cleaning surface of the silicon substrate 1.

Figure 1P:
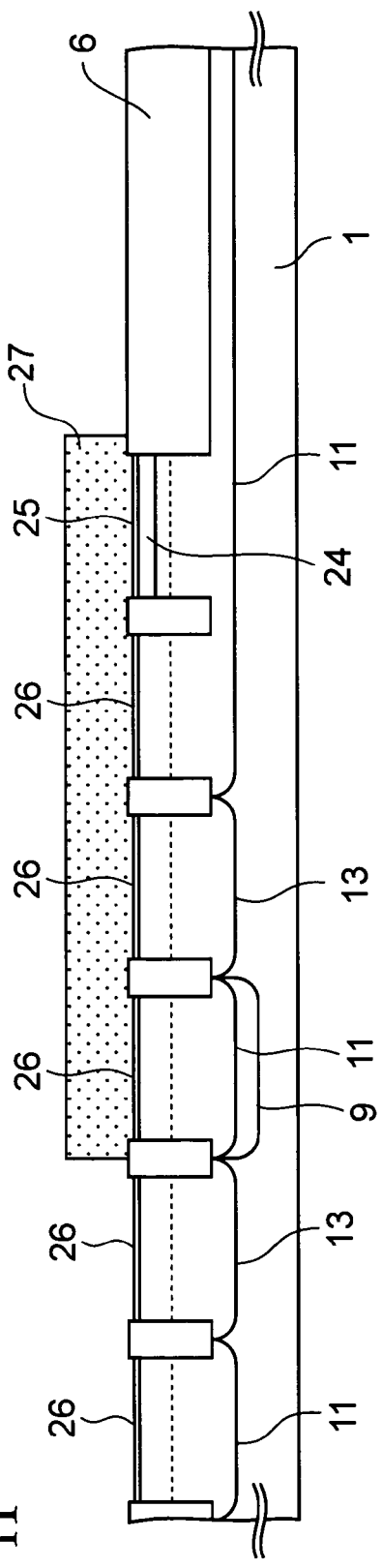

Then, as shown in FIG. 1P, through thermal oxidation in steam atmosphere with the substrate temperature being about 800° C., a thermal oxidation film of about 5 nm in thickness is formed in the portion of the surface of the silicon substrate 1 corresponding to the transistor formation regions I and II in order to form a first gate insulating film 26. Along with this, the amorphous layer 1b (see FIG. 1N) produced while the n-type impurity diffusion region 24 is formed is crystallized to some degree with the heat applied during the thermal oxidation.

In the above thermal oxidation method, a thermal oxidation film is also formed in the capacitor formation region III of the surface of the silicon substrate 1. It should be noted, however, that the n-type impurity diffusion region 24 also serving as the lower electrode of the capacitor is formed in the capacitor formation region III, and the silicon substrate 1 undergoes accelerated oxidation due to the arsenic in the n-type impurity diffusion region 24. Accordingly, the thickness of the thermal oxidation film formed in the capacitor formation region III is larger than that in the transistor formation regions I and II, the thickness being about, for example, 8 nm. Such a thick thermal oxidation film is used as a capacitor dielectric film 25 in this embodiment. The n-type impurity diffusion region 24 also serves to increase the thickness of the capacitor dielectric film 25 due to the accelerated oxidation mentioned above to thereby enhance the breakdown voltage thereof.

Thereafter, a tenth resist pattern 27 is formed on the silicon substrate 1, leaving the n-type low voltage MOS transistor formation region I$_n$ and the p-type low voltage MOS transistor formation region I$_p$ exposed.

Next, as shown in FIG. 1Q, the portions of the first gate insulating film 26 which are not covered with the tenth resist pattern 27 are removed by wet etching using a hydrofluoric acid solution as the etching solution, thereby exposing the cleaning surface of the silicon substrate 1 in each of the regions I$_n$ and I$_p$.

Thereafter, as shown in FIG. 1R, the tenth resist pattern 27 is removed.

Figure 1S:
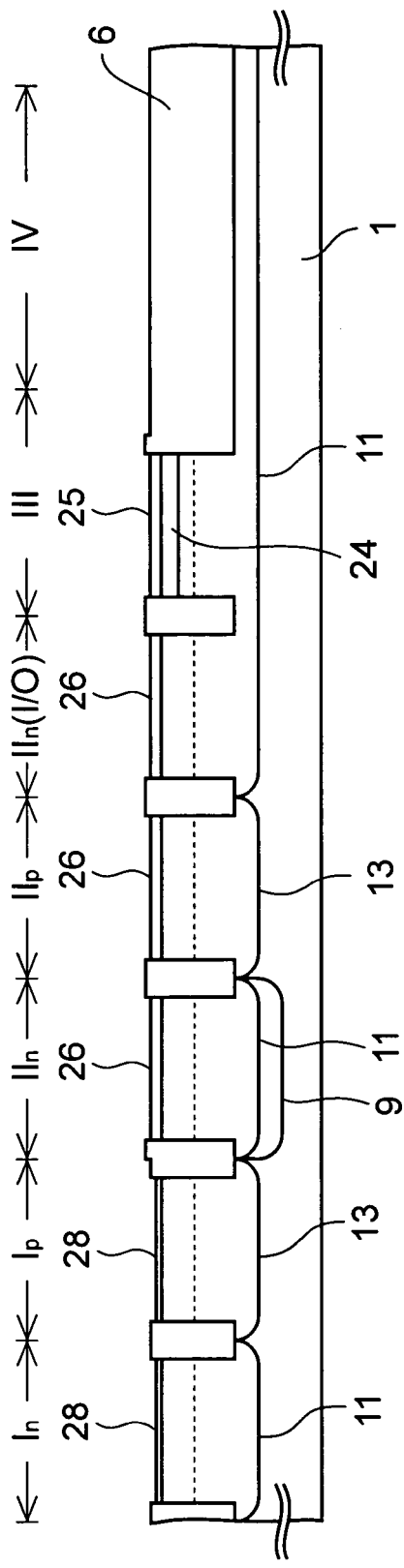

Next, as shown in FIG. 1S, the silicon substrate 1 is heated to about 750° C. in steam atmosphere, whereby the n-type low voltage MOS transistor formation region I$_n$ and the p-type low voltage MOS transistor formation region I$_p$ of the silicon substrate 1 undergoes thermal oxidation again to thereby form a thermal oxidation film at a thickness of about 1.8 nm. The thermal oxidation film thus formed serves as a second gate insulating film 28.

In the above thermal oxidation, the portions of the silicon substrate 1 under the first gate insulating film 26 and the capacitor dielectric film 25 also undergo oxidation, so the first gate insulating film 26 and the capacitor dielectric film 25 each having an original thickness on the order of 5 nm are increased in thickness to about 9 nm. As a result, two kinds of gate insulating films 26 and 28 that differ in thickness are formed on the silicon substrate 1.

Figure 1T:
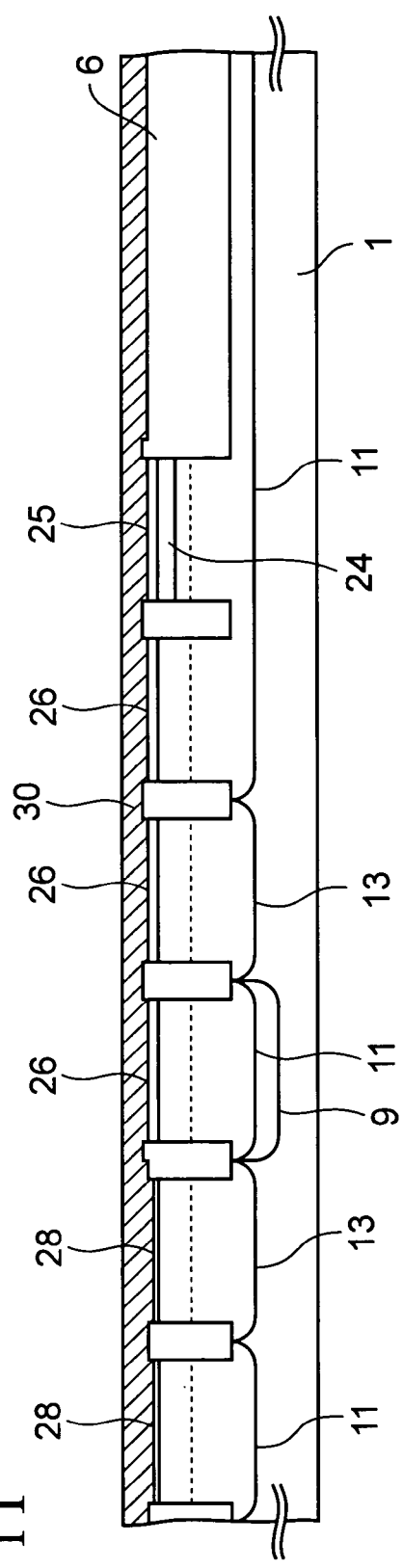

Subsequently, as shown in FIG. 1T, by use of a low pressure CVD method with silane serving as the reaction gas, a polysilicon film is formed on each of the first and second gate insulating films 26 and 28 and on the capacitor dielectric film 25 at a thickness of about 180 nm. The films thus formed serves as a conductive film 30.

Next, as shown in FIG. 1U, an eleventh resist pattern 31 is formed on the conductive film 30. Then, the conductive film 30 is subjected to dry etching using the eleventh resist pattern 31 as the mask. The portions of the conductive film 30 that remain under the eleventh resist pattern 31 without being etched away serve as a gate electrode 30a, a capacitor upper electrode 30b, and a resistance pattern 30c. Among those, the capacitor upper electrode 30b is formed in the portion of the capacitor formation region III excluding a contact region CR.

Thereafter, the eleventh resist pattern 31 is removed.

Next, as shown in FIG. 1V, a twelfth resist pattern 32 is formed on the silicon substrate 1. Then, an n-type impurity such as phosphorous is ion-implanted into the silicon substrate 1 through windows of the twelfth resist pattern 32, whereby a first n-type source/drain extension 33 are formed in each of the n-type high voltage MOS transistor formation region II$_n$ and the input/output n-type high voltage MOS transistor formation region II$_n$(I/O).

Further, during the above ion implantation, the above-mentioned n-type impurity are also implanted into the silicon substrate 1 in the contact region CR not covered with the capacitor upper electrode 30b, whereby a low-concentration n-type impurity diffusion region for contact 34 is formed in the contact region CR.

Thereafter, the twelfth resist pattern 32 that has been used as the mask is removed.

Then, in order to prevent the first n-type source/drain extension 33 and the low-concentration n-type impurity diffusion region for contact 34 from undergoing diffusion in the subsequent thermal processes to cause the concentration distributions thereof to spread, annealing may be performed on the silicon substrate 1 at this point so that the first n-type source/drain extension 33 and the low-concentration n-type impurity diffusion region for contact 34 may previously be subjected to diffusion to some extent. The annealing at this time is carried out in nitrogen atmosphere at a substrate temperature of about 700° C. to 800° C. for about 120 minutes.

Figure 1W:
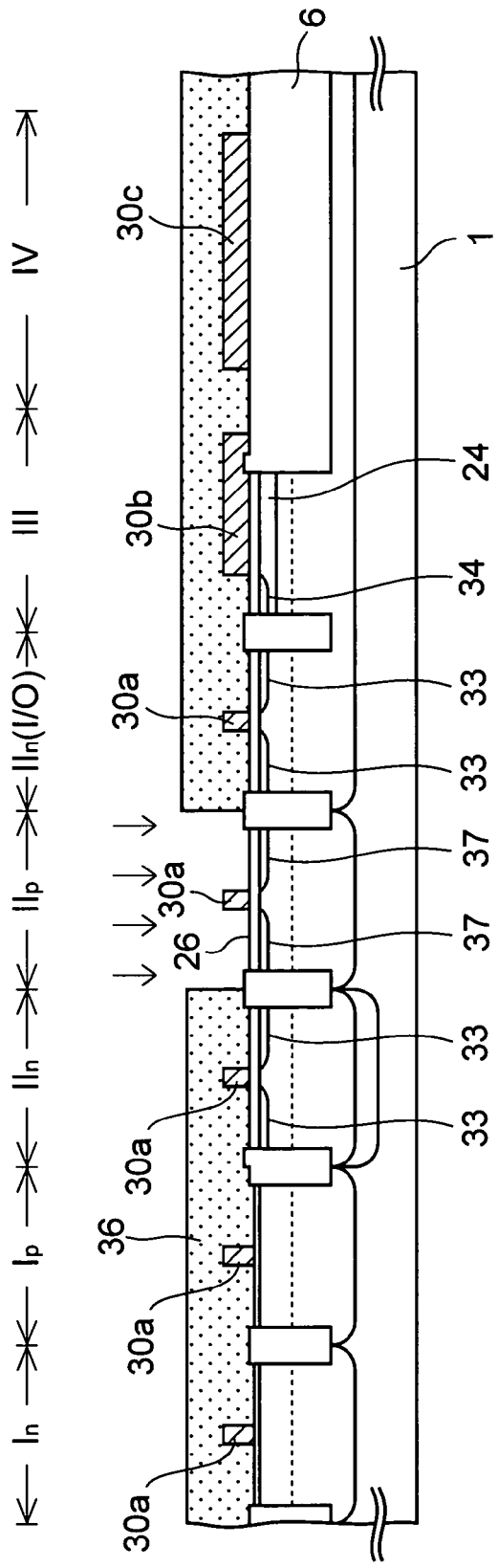

Subsequently, as shown in FIG. 1W, using a thirteenth resist pattern 36 formed on the silicon substrate 1 as the mask, a p-type impurity such as boron fluoride is ion-implanted into the p-type high voltage MOS transistor formation region II$_p$ of the silicon substrate 1 to thereby form a first p-type source/drain extension 37.

Thereafter, the thirteenth resist pattern 36 is removed.

Figure 1X:
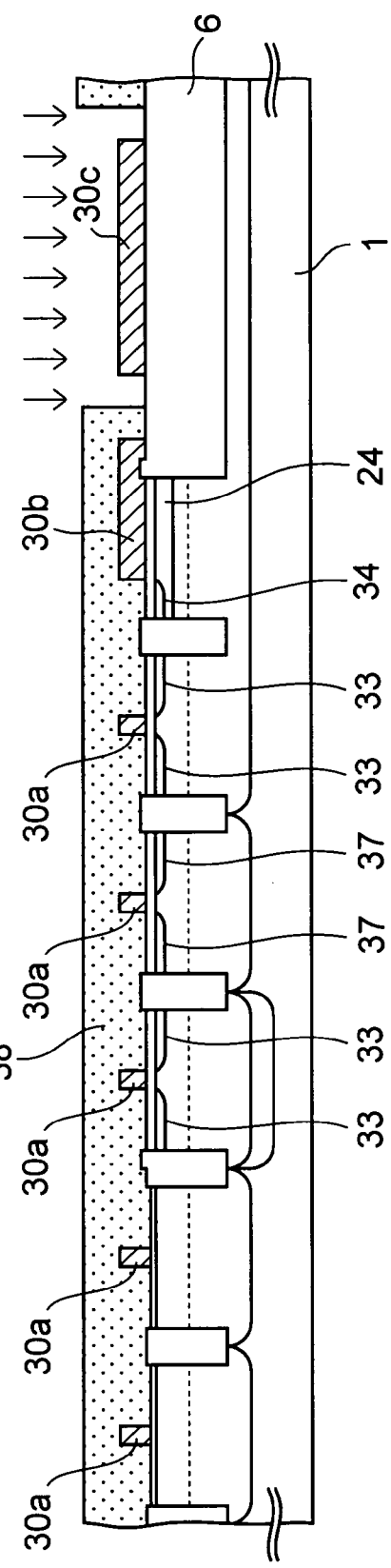

Next, as shown in FIG. 1X, a fourteenth resist pattern 38, which is provided with a window through which the resist pattern 30c is exposed, is formed on the silicon substrate 1. Then, an impurity such as boron is ion-implanted through the window of the fourteenth resist pattern 38 in order to reduce the resistance of the resistance pattern 30c.

After completing the above ion implantation, the fourteenth resist pattern 38 is removed.

Figure 1Y:
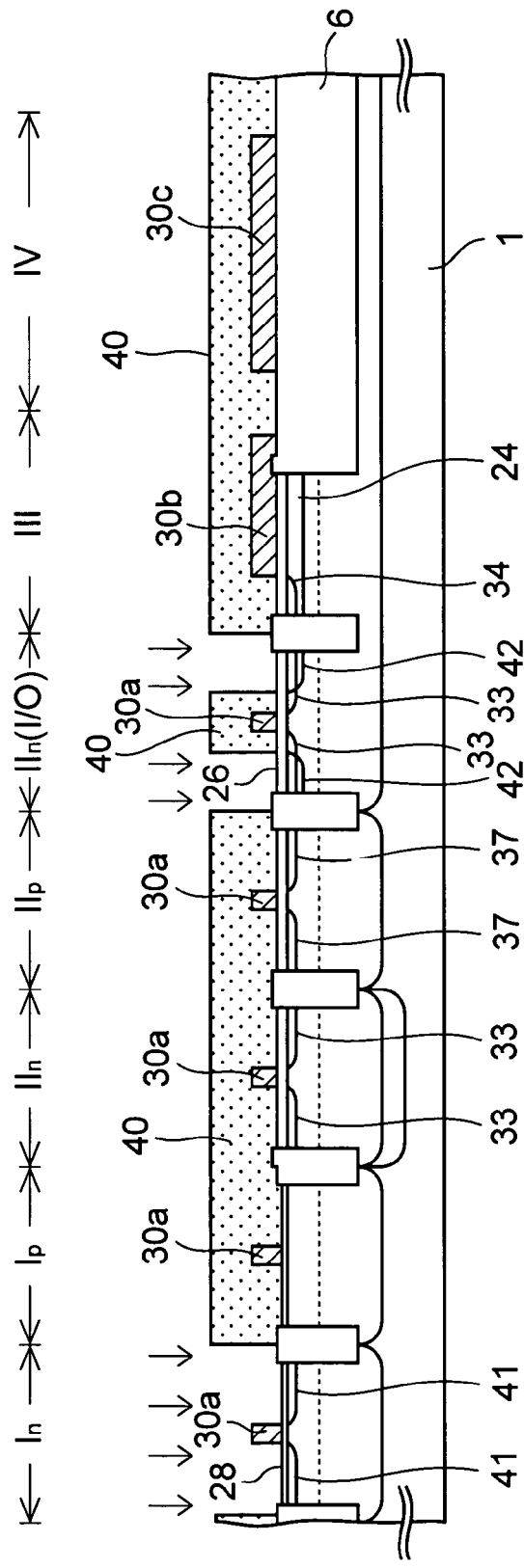

Subsequently, as shown in FIG. 1Y, a fifteenth resist patter 40 is formed on the silicon substrate 1, the fifteenth resist pattern 40 having windows through which the n-type low voltage MOS transistor formation region I$_n$ and parts of the input/output n-type high voltage MOS transistor formation region II$_n$(I/O) are exposed. It should be noted that the portion of the gate electrode 30a and its vicinity in the region II$_n$(I/O) is covered with the fifteenth resist pattern 40 formed in an island-like shape.

Then, with the fifteenth resist pattern 40 as the mask, an n-type impurity such as arsenic is ion-implanted into the silicon substrate 1, whereby a second n-type source-drain extension 41 is formed in the n-type low voltage MOS transistor formation region I$_n$ and two high-concentration n-type impurity diffusion regions 42 are formed in the region II$_n$(I/O). The distance between the two high-concentration n-type impurity diffusion regions 42 increases due to the use of the island-like fifteenth resist pattern 40 as the mask in the region II$_n$(I/O), whereby the breakdown voltage therebetween is enhanced.

Thereafter, the fifteenth resist pattern 40 is removed.

Figure 1Z:
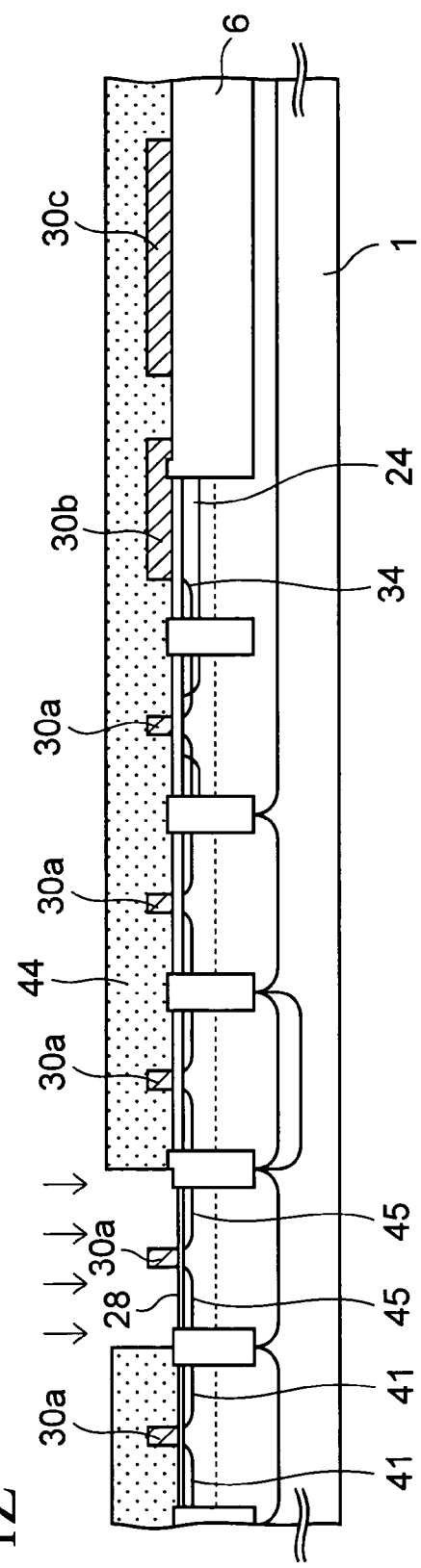

Next, as shown in FIG. 1Z, with a sixteenth resist pattern 44 formed on the silicon substrate 1 as the mask, a p-type impurity such as boron is ion-implanted into the silicon substrate 1 in order to form a second p-type source/drain extension 45 in the p-type low voltage MOS transistor formation region I$_p$.

Thereafter, the sixteenth resist pattern 44 is removed.

Next, as shown in FIG. 2A, a silicon oxide film is formed on the entire upper surface of the silicon substrate 1 through a CVD method. The silicon oxide film thus formed serves as a sidewall insulating film 46.

Then, a photoresist is applied onto the sidewall insulating film 46 followed by exposure and development thereof, whereby a seventeenth resist pattern 47 is formed in each of the input/output n-type high voltage MOS transistor formation region II$_n$(I/O) and the resistance formation region IV.

Subsequently, as shown in FIG. 2B, with the seventeenth resist pattern as the mask, the sidewall insulating film 46 is etched back so that the sidewall insulating film 46 remains as an insulative sidewall 46a by the side of each of the gate electrode 30a, the capacitor upper electrode 30b, and the resistance patter 30c. During the etching back, the first and second gate electrodes 26 and 28, and the capacitor dielectric film 25, which are situated by the side of the insulative sidewall 46a, are also etched away. As a result, in the capacitor formation region III, the silicon substrate 1 is exposed in the contact region CR situated by the side of the capacitor upper electrode 30b.

Further, the sidewall insulating film 46 under the seventeenth resist pattern 47 is allowed to remain as silicide blocks 46b and 46c in the regions II$_n$(I/O) and IV, respectively.

Thereafter, the seventeenth resist pattern 47 is removed.

Next, as shown in FIG. 2C, with an eighteenth resist pattern 50 formed on the silicon substrate 1 as the mask, a p-type impurity such as boron is ion-implanted into the silicon substrate 1 in order to form a p-type source/drain region 51 by the side of the gate electrode 30a in each of the regions I$_p$ and II$_p$ of the silicon substrate 1. Further, during this ion implantation, a p-type impurity is also ion-implanted into the portion of the resistance pattern 30c which is not covered with the silicide block 46c, so the portion of the resistance pattern 30c undergoes a reduction in resistance.

After completing the ion implantation, the eighteenth resist pattern 50 is removed.

Next, as shown in FIG. 2D, a photoresist is applied onto the entire upper surface of the silicon substrate 1 followed by exposure and development thereof, whereby a nineteenth resist pattern 52 is formed. Then, an n-type impurity such as phosphorous is ion-implanted into the silicon substrate through windows of the nineteenth resist pattern 52. Accordingly, an n-type source/drain region 53 is formed by the side of the gate electrode 30a in each of the regions I$_n$, II$_n$, and II$_n$(I/O) of the silicon substrate 1. Further, in the capacitor formation region III, a high-concentration n-type impurity diffusion region for contact 54 is formed in the contact region CR situated by the side of the capacitor upper electrode 30b.

Thereafter, the nineteenth resist pattern 52 is removed.

Figure 2E:
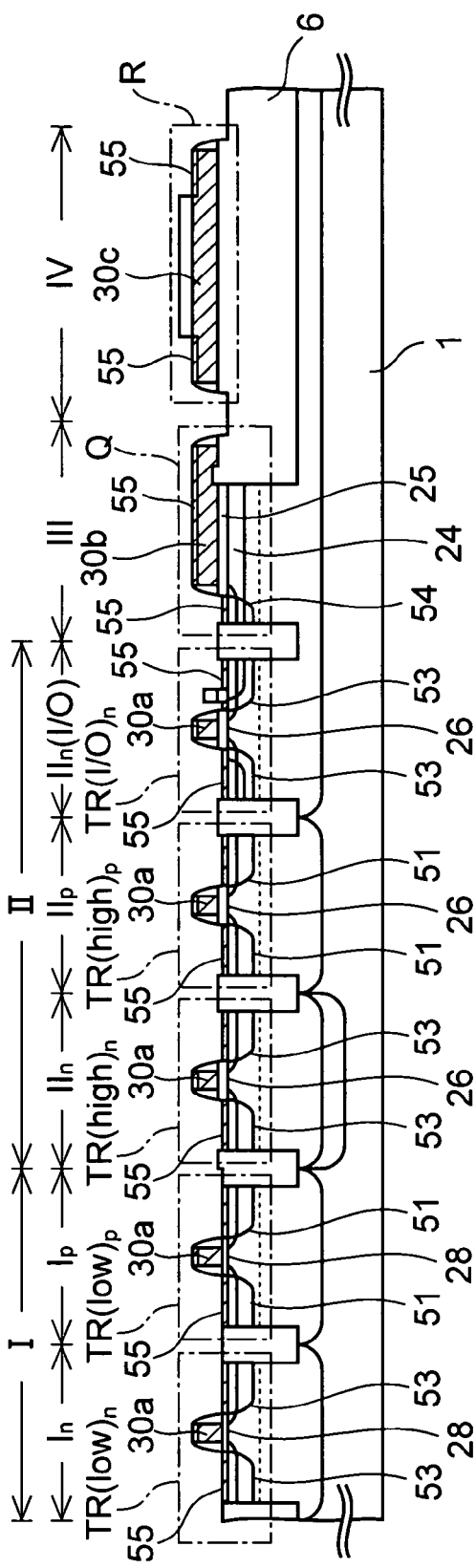

Next, the processes to be performed before obtaining the sectional structure shown in FIG. 2E will be described.

First, as the activation annealing for activating the impurity contained in each of the source/drain regions 51 and 53, RTA is carried out in nitrogen atmosphere with the substrate temperature being 1000° C. and the processing time for 10 seconds. The activation annealing causes the amorphous layer 1b (see FIG. 1N) formed on the silicon substrate 1 to crystallize again.

Next, a high-melting metal layer such as a cobalt layer is formed on the entire upper surface of the silicon substrate 1 by a sputtering method. Then, the silicon substrate 1 is heated to cause the high-melting metal layer and silicon to react with each other, whereby a high-melting metal silicide layer 55 is formed on each of the silicon substrate 1 and the gate electrode 30a. Thereafter, the high-melting metal layer that remains on the device isolation insulating film 6 or the like without undergoing reaction is removed by wet etching.

Through the foregoing processes, n-type MOS transistors TR(low)$_n$, TR(high)$_n$, and TR(I/O)$_n$, p-type MOS transistors TR(low)$_p$ and TR(high)$_p$, a capacitor Q, and a resistance R, which constitute an analog circuit, are formed in the silicon substrate 1 as shown in the drawing.

Among those, the transistors TR(high)$_n$, TR(high)$_p$, and TR(I/O)$_n$ can be driven at a high voltage of, for example, about 3.3 V due to the first gate insulating film 26 whose thickness has been increased to be 9 nm by the thermal oxidation performed twice. On the other hand, each of the transistors TR(low)$_n$ and TR(low)$_p$ has the second gate insulating film 28 with a small thickness of about 5 nm, and the drive voltage thereof is low at 1.2 V.

Further, the capacitor Q is constituted of the n-type impurity diffusion region 24 functioning as the lower electrode, the capacitor dielectric film 25, and the capacitor upper electrode 30b, and has the function of converting an applied voltage into an electric charge amount to thereby execute the addition/subtraction of the applied voltage (information) by replacing it with the sum/difference of the electric charge amount.

Figure 2F:
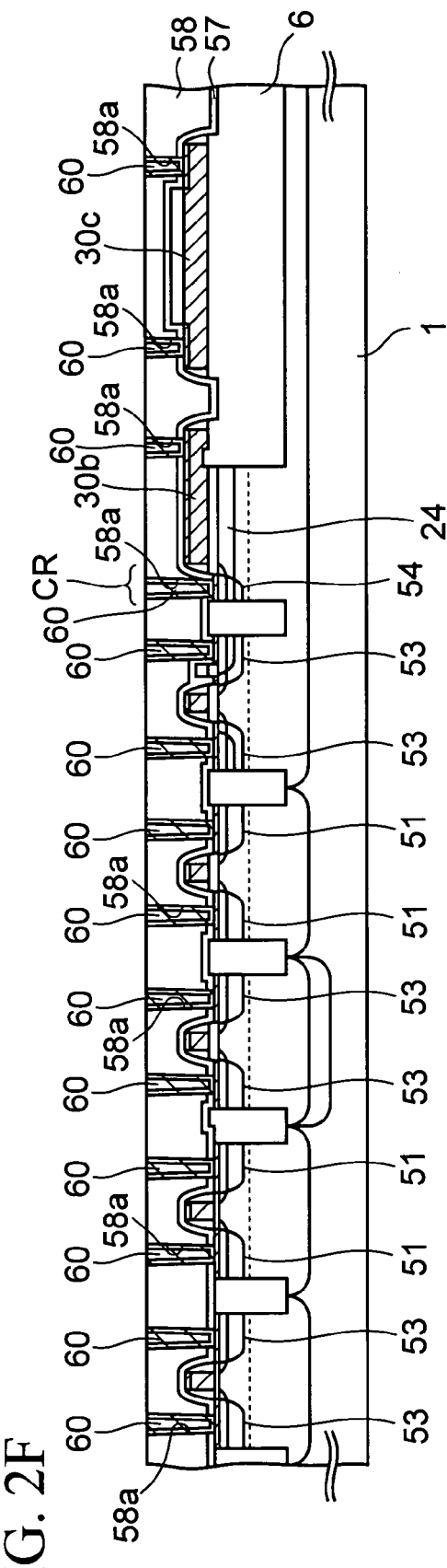

Subsequently, as shown in FIG. 2F, a silicon oxide film having a thickness of about 20 nm and a silicon nitride film having a thickness of about 70 nm are formed in the stated order on the entire surface by a plasma CVD method. Those films serve as a cover insulating film 57. Further, a silicon oxide film is formed at a thickness of about 1000 nm on the cover insulating film 57 by an HDPCVD method as an interlayer dielectric 58. Thereafter, the upper surface of the interlayer dielectric 58 is polished for flattening by a CMP method in order to make the thickness of the interlayer dielectric 58 on the flat surface of the silicon substrate 1 be about 70 nm.

Next, the interlayer dielectric 58 and the cover insulating film 57 are subjected to patterning by photolithography, whereby a hole 58a is formed at a position above each of the p-type source-drain region 51 and the n-type source/drain region 53. Further, through this patterning, the hole 58a is also formed at a position above each of the contact region CR and capacitor upper electrode 30b of the capacitor formation region III, and of the resistance pattern 30c.

Then, a titanium film of about 20 nm to 50 nm in thickness and a titanium nitride film of about 50 nm in thickness are formed in the stated order on the inner surface of the hole 58a and on the interlayer dielectric 58 by a sputtering method. Further, a tungsten film is formed on the titanium nitride film by a CVD method using tungsten hexafluoride as the reaction gas. The tungsten film thus formed completely fills the hole 58a. Thereafter, any excess titanium film, titanium nitride film, and tungsten film on the interlayer dielectric 58 are removed through polishing by a CMP method, with those films being allowed to remain inside the hole 58a as conductive plugs 60.

The two conductive plugs 60 formed in the capacitor formation region III are electrically connected to the high-concentration impurity diffusion region for contact 54 in the contact region CR and to the capacitor upper electrode 30b, respectively, and serve to apply a voltage to the capacitor Q.

Through the foregoing processes, the basic structure of the semiconductor device according to the embodiment is completed.

According to the semiconductor device manufacturing method described above, the capacitor Q with the n-type impurity diffusion region 24 serving as the lower electrode can be formed by simply adding the process of ion-implanting an impurity into the n-type impurity diffusion region 24, the process described with reference to FIG. 1N, in addition to the manufacturing process for the respective MOS transistors to be formed in the transistor formation regions I and II. Accordingly, it makes it possible to readily manufacture a semiconductor device loaded with both the capacitor Q and the MOS transistors.

Incidentally, when the impurity concentration in the n-type impurity diffusion region 24 is increased, the depletion of the surface of the silicon substrate 1 in the region 24 can be suppressed, whereby it makes possible to suppress variations in the capacitance of the capacitor Q due to the depletion.

However, when the beam current to be applied during the ion-implantation of arsenic is increased in order to increase the impurity concentration in the n-type impurity diffusion region 24, the damage inflicted on the silicon substrate 1 upon the ion-implantation becomes large. As a result, there is a fear that the amorphous layer 1b (see FIG. 1N) formed due to the damage inflicted at this time does not undergo sufficient crystallization due to the heat applied when the capacitor dielectric film 25 is formed by thermal oxidation, and that the quality of the capacitor dielectric film 25 degrades due to the influence of the uncrystallized amorphous film 1b, and accordingly, that a decrease in the breakdown voltage of the dielectric film 25 is caused.

In order to avoid such an inconvenience, it is necessary to determine the upper limit for the amount of current to be applied when performing ion-implantation on the n-type impurity diffusion region 24, and to ion-implant arsenic into the silicon substrate 1 in an amount of current not exceeding the upper limit. In view of this, the inventor of the present invention conducted the following examination in order to determine such an upper limit for the beam current.

Figure 3:
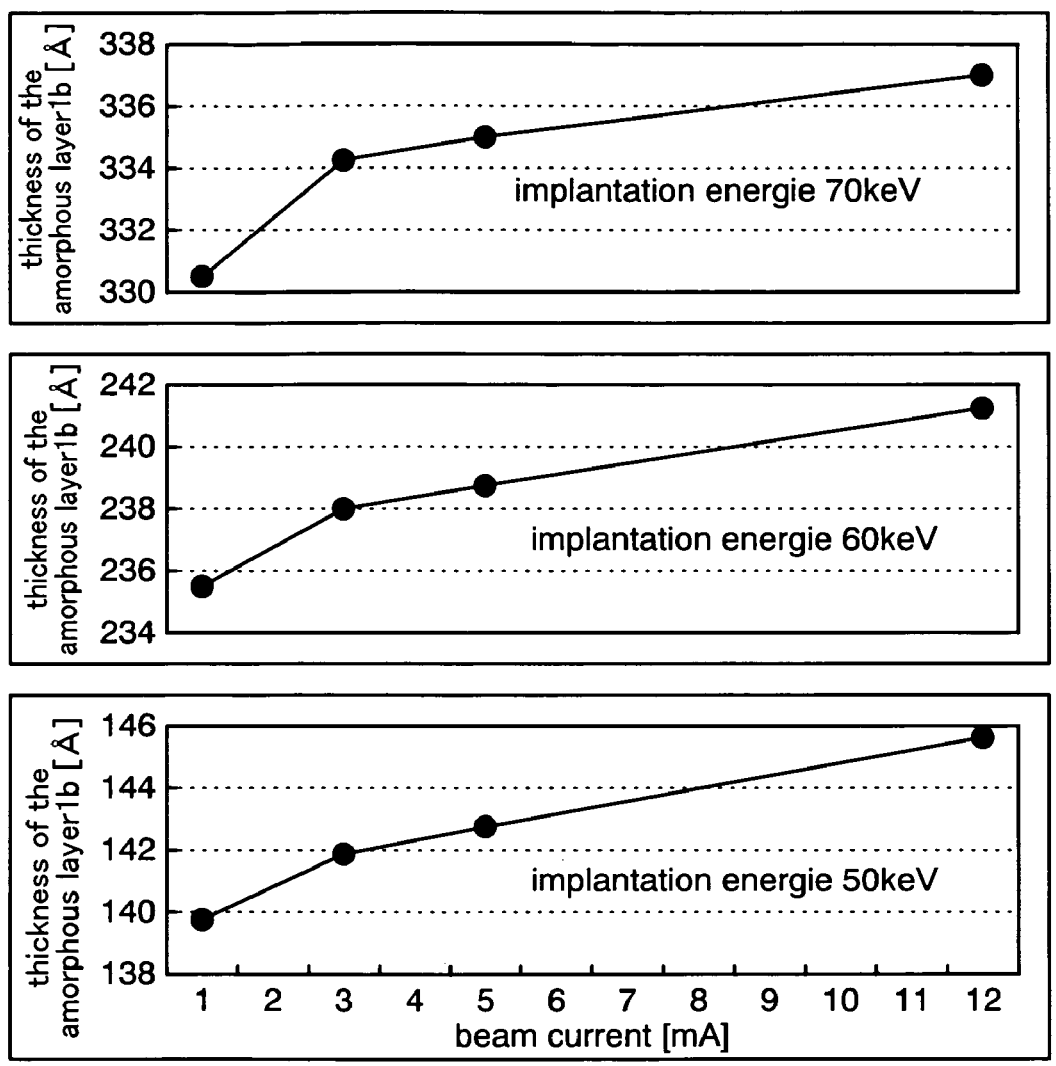
FIG. 3 is a graph obtained through examination of the relationship between a beam current and a thickness of an amorphous layer in the case where arsenic is ion-implanted into a silicon substrate through a thermal oxidation film having a thickness of 10 nm.

FIG. 3 is a graph obtained through examination of the relationship between a beam current and a thickness of an amorphous layer 1b in the case where arsenic is ion-implanted into a silicon substrate 1 through a thermal oxidation film 2 having a thickness of 10 nm in the process of FIG. 1N. Note that the thickness of the amorphous layer 1b was measured by an ellipsometry method.

Further, this examination was carried out with respect to three cases where the arsenic implantation energies are 50 keV, 60 keV, and 70 keV, respectively.

As shown in FIG. 3, with each the implantation energies, the thickness of the amorphous layer 1b gradually decreases as the magnitude of the beam current decreases from 12 mA to 3 mA. However, when the beam current becomes less than 3 mA, the rate of the decrease in the thickness of the amorphous layer 1b becomes rapid.

Figure 4:
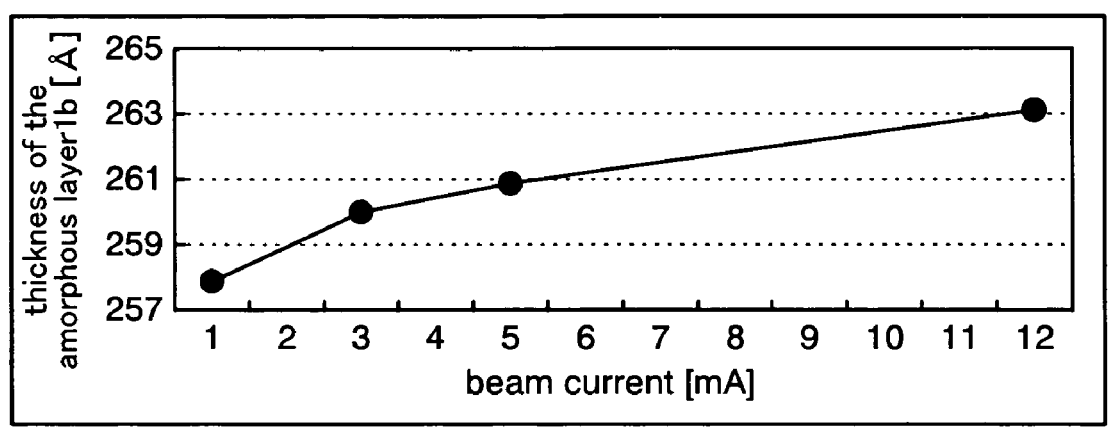
FIG. 4 is a graph obtained through examination of the relationship between the beam current and the thickness of the amorphous layer in the case where arsenic is directly ion-implanted into the silicon substrate without the thermal oxidation layer formed on the silicon substrate.

Further, FIG. 4 is a graph obtained through examination of the relationship between the beam current and the thickness of the amorphous layer 1b in the case where arsenic is directly ion-implanted into the silicon substrate 1 without forming the thermal oxidation layer 2.

As shown in FIG. 4, even in the case where the thermal oxidation film 2 is not formed, the amorphous layer 1b undergoes a large decrease in thickness by making the beam current be less than 3 mA in the same manner as in FIG. 3.

From the results of the FIGS. 3 and 4, it is presumed that the breakdown voltage of the capacitor dielectric film 25 due to the amorphous layer 1b can be increased by making the beam current be less than 3 mA. To confirm this, the inventor of the present invention conducted the following experiment.

In this experiment, three silicon substrates 1 were prepared, and arsenic was ion-implanted into the respective silicon substrates 1 at different current amounts (1 mA, 3 mA, and 12 mA) to thereby form the n-type impurity diffusion region 24. Then, after a plurality of capacitors Q were formed in each of the three silicon substrates, by gradually charging the respective capacitors Q, the number of capacitors Q that became defective as the capacitor dielectric film 25 broke down was determined with respect to each wafer.

Figure 5:
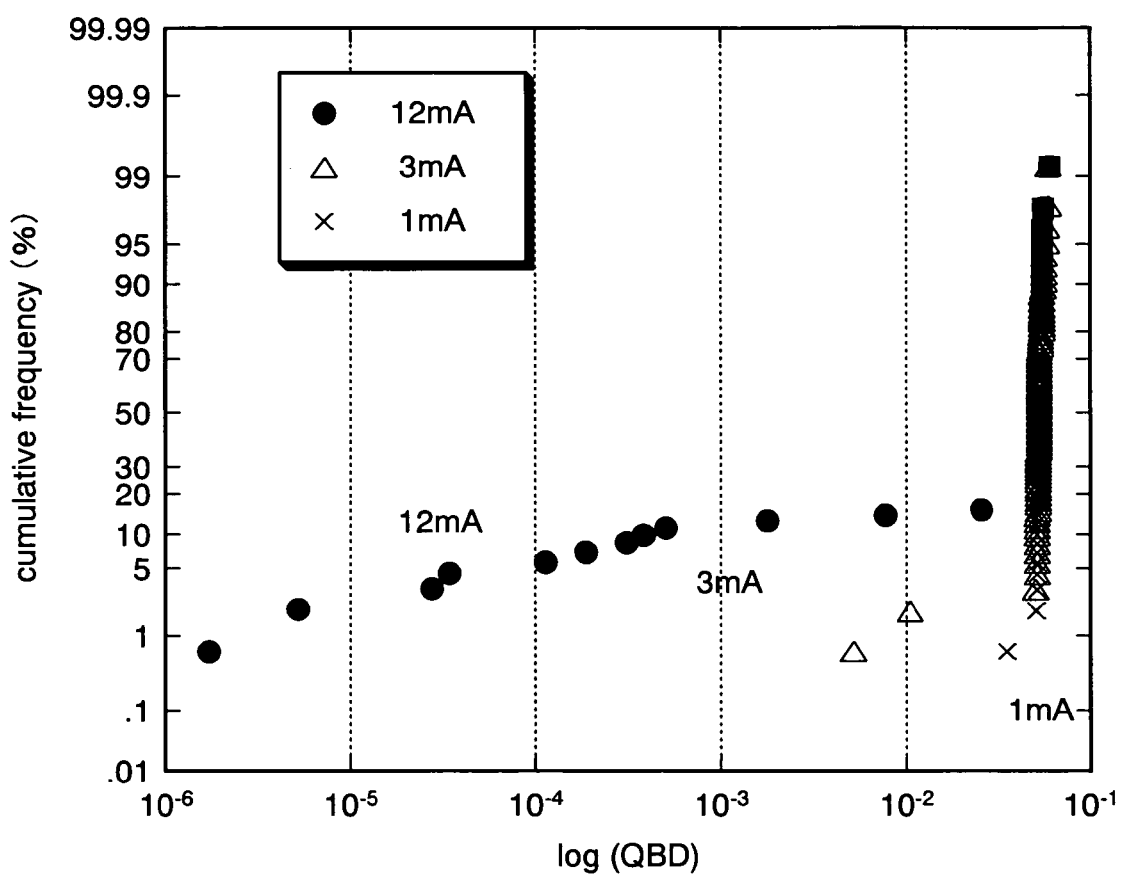
FIG. 5 is a graph obtained through examination of the relationship between the amount of charge per unit area accumulated in capacitors, and the cumulative frequency of the capacitors that became defective.

FIG. 5 shows the results. It should be noted that in FIG. 5, the horizontal axis represents the logarithm of the charge amount (QBD(C/cm$^2$)) per unit area accumulated in the capacitors Q, and the vertical axis represents the cumulative frequency of the capacitors Q that became defective.

As shown in FIG. 5, in the case where the beam current is 12 mA, defective capacitors Q exist even in the region where the logarithm of the charge amount QBD is $10^{-5}$ or less. From this, it is confirmed that the breakdown voltage of the capacitor dielectric film 25 actually decreases due to a large beam current.

On the other hand, in the case where the beam current is 3 mA, there exists no defective capacitor Q when the logarithm of the charge amount is less than $10^{-3}$.

Further, in the case where the beam current is the lowest at 1 mA, all the capacitors Q became defective at substantially the same time in the region where the logarithm of the charge amount is between $10^{-2}$ and $10^{-1}$. This indicates that the breakdown voltage of the capacitor dielectric film 25 is increased in this case.

The above results make it clear that, in order to increase the breakdown voltage of the capacitor dielectric film 25 to enhance the breakdown voltage between electrodes of the capacitor Q, the beam current to be applied when forming the n-type impurity diffusion region 24 through ion implantation may be set to be lower than 3 mA.

Since such a low beam current cannot be realized with high-current ion implantation devices conventionally used in order to generate a high beam current on the order of 10 mA to 20 mA, the n-type impurity diffusion region 24 is preferably formed by using an ion implantation device adapted to generate a low beam current below 10 mA.

On the other hand, the lower limit for the beam current is set to 1 μA which is the smallest value of the beam current that can be generated by this ion implantation device.

It should be noted, however, that the product of the beam current and the implantation time becomes the dose amount in the ion implantation process, so a longer implantation time is required to attain a desired dose amount when the beam current is small. For this reason, in the actual production lines, the beam current to be applied is preferably determined within the range of 1 μA to 3 mA in balance with the throughput of the ion implantation process.

While in the foregoing embodiment of the present invention has been described in detail so far, the present invention is not limited to the one described above. For example, while in the above description the n-type impurity region 24 is formed on the p-well 11, the p-type impurity diffusion region may be formed on the n-well to make this region serve as the lower electrode of the capacitor Q. In this case, BF$_2$ (boron fluoride) is employed as the kind of ion to be used when the p-type impurity diffusion region is formed through ion implantation.

According to the present invention, the beam current to be applied when the impurity diffusion region is formed in the semiconductor substrate through ion implantation is set to be equal to or more than 1 μA but less than 3 mA, whereby the breakdown voltage of the capacitor dielectric film on the impurity diffusion region can be enhanced and it makes it possible to form a high quality capacitor.

What is claimed is:

1. A semiconductor device manufacturing method comprising:

forming an impurity diffusion region in a semiconductor substrate by ion-implanting an impurity into a capacitor formation region of the semiconductor substrate under a condition that a beam current is equal to or more than 1 μA but less than 3 mA;

forming a capacitor dielectric film on and in contact with the impurity diffusion region of the semiconductor substrate by thermally oxidizing a surface of the semiconductor substrate in the impurity diffusion region to form a thermal oxidation film which serves as the capacitor dielectric film; and forming a capacitor upper electrode on the capacitor dielectric film, wherein, when forming the capacitor dielectric film, a gate insulating film formed of the same insulating film as that forming the capacitor dielectric film is formed on a transistor formation region of the semiconductor substrate, and wherein, when forming the capacitor upper electrode, a gate electrode formed of the same conductive film as that forming the capacitor upper electrode is formed on the gate insulating film.

2. The semiconductor device manufacturing method according to claim 1, wherein arsenic is used as the impurity when ion-implanting the impurity.

3. The semiconductor device manufacturing method according to claim 1, wherein boron fluoride is used as the impurity when ion-implanting the impurity.

4. The semiconductor device manufacturing method according to claim 1, wherein an implantation energy is set to be equal to or higher than 50 keV but not higher than 70 keV when ion-implanting the impurity.

5. The semiconductor device manufacturing method according to claim 1, wherein, when forming the capacitor upper electrode, the capacitor upper electrode is formed in a region of the capacitor formation region excluding a contact region, and wherein the semiconductor device manufacturing method further comprises exposing a surface of the semiconductor substrate in the contact region by removing the capacitor dielectric film in the contact region after forming the capacitor upper electrode.

6. The semiconductor device manufacturing method according to claim 5, further comprising:

forming an interlayer dielectric covering the capacitor upper electrode and the contact region, after exposing the surface of the semiconductor substrate in the contact region;

forming holes in the interlayer dielectric on each of the contact region and the capacitor upper electrode; and forming conductive plugs inside the holes, the conductive plugs being electrically connected to each of the contact region and the capacitor upper electrode.

7. The semiconductor device manufacturing method according to claim 1, further comprising forming a device isolation insulating film in the semiconductor substrate prior to forming the capacitor dielectric film, wherein, when forming the capacitor upper electrode, a resistance pattern formed of the same conductive film as that forming the capacitor upper electrode is formed on the device isolation insulating film.

8. The semiconductor device manufacturing method according to claim 1 or claim 7, wherein a polysilicon film is formed as the conductive film.

9. The semiconductor device manufacturing method according to claim 1, wherein a silicon substrate is used as the semiconductor substrate.

10. The semiconductor device manufacturing method according to claim 6, further comprising:

forming a thermal oxidation film on the semiconductor substrate before forming the impurity diffusion region; and removing the thermal oxidation film after forming the impurity diffusion region and before forming the capacitor dielectric film;

wherein, when forming the impurity diffusion region, the impurity is ion-implanted into the capacitor formation region of the semiconductor substrate through the thermal oxidation film.

\* \* \* \* \*